United States Patent
Yokoi

(10) Patent No.: US 7,940,563 B2
(45) Date of Patent: May 10, 2011

(54) NONVOLATILE STORAGE DEVICE AND BIAS CONTROL METHOD THEREOF

(75) Inventor: Atsushi Yokoi, Seto (JP)

(73) Assignee: Spansion LLC, Sunnyvale, CA (US)

( * ) Notice: Subject to any disclaimer, the term of this patent is extended or adjusted under 35 U.S.C. 154(b) by 457 days.

(21) Appl. No.: 12/109,239

(22) Filed: Apr. 24, 2008

(65) Prior Publication Data

US 2008/0316821 A1    Dec. 25, 2008

(30) Foreign Application Priority Data

Apr. 27, 2007  (JP) ................. 2007-118845

(51) Int. Cl.
G11C 5/02  (2006.01)
G11C 5/06  (2006.01)
G11C 16/04  (2006.01)
G11C 16/02  (2006.01)

(52) U.S. Cl. .......... 365/185.05; 365/51; 365/63; 365/72

(58) Field of Classification Search .......... 365/185.05, 365/185.06, 185.16, 185.18, 63, 72, 51
See application file for complete search history.

(56) References Cited

U.S. PATENT DOCUMENTS

| | | | |
|---|---|---|---|
| 5,398,204 A * | 3/1995 | Maruyama | 365/185.3 |
| 5,671,177 A * | 9/1997 | Ueki | 365/185.11 |
| 6,831,872 B2 | 12/2004 | Matsuoka | |
| 6,862,213 B2 | 3/2005 | Hamaguchi | |
| 6,888,773 B2 | 5/2005 | Morimoto | |
| 6,906,940 B1 | 6/2005 | Lue | |
| 6,967,867 B2 | 11/2005 | Hamaguchi | |
| 6,995,999 B2 | 2/2006 | Morimoto | |
| 7,002,837 B2 | 2/2006 | Morimoto | |
| 7,016,222 B2 | 3/2006 | Morikawa | |
| 7,045,840 B2 | 5/2006 | Tamai et al. | |
| 7,057,922 B2 | 6/2006 | Fukumoto | |
| 7,208,751 B2 | 4/2007 | Ooishi | |
| 2002/0002654 A1 * | 1/2002 | Tomohiro | 711/103 |
| 2003/0185048 A1 * | 10/2003 | Fricke et al. | 365/170 |

FOREIGN PATENT DOCUMENTS

JP    2004355670 B    12/2004

* cited by examiner

*Primary Examiner* — J. H. Hur

(57) ABSTRACT

A nonvolatile storage device having a memory cell array composed of a plurality of memory cells. The plurality of memory cells include a bit line to which the drain terminals of the plurality of memory cells that have noncovalent connected gate terminals are commonly connected and a source line to which the source terminals of the plurality of memory cells that have commonly connected gate terminals are commonly connected and which extend perpendicularly to the bit line. The memory cell also includes a first source selector switch for connecting the source line to a source bias line.

14 Claims, 10 Drawing Sheets

NONVOLATILE STORAGE DEVICE AND BIAS CONTROL METHOD THEREOF

RELATED U.S. APPLICATION

This Application claims priority to Japanese Patent Application 2007-118845 entitled "Nonvolatile Storage Device and Bias Control Method Thereof" filed Apr. 27, 2007 which is incorporated herein in its entirety.

FIELD OF THE INVENTION

The invention relates to a nonvolatile storage device and a bias control method thereof.

BACKGROUND

U.S. Pat. No. 6,906,940 discloses a three-dimensional memory 100 that has, as shown in FIG. 10, a source plane SP to which source lines connected to the source terminals of memory cells 105 are commonly connected; a drain plane DP to which bit lines connected to the drain terminals of the memory cells 105 are commonly connected; and a word plane WP to which word lines connected to the gate terminals of the memory cells 105 are commonly connected. In the three-dimensional memory 100, the planes SP, DP, WP are perpendicular to one another.

As illustrated in FIG. 10, memory cell arrays 101, 102 etc. are stacked, forming multiple layers, and the source terminals of the memory cells 105 (106) arranged in each memory layer are commonly connected to its associated source plane SP. The source plane SP of the memory layer where a selected memory cell 105 exists is connected to ground potential (0V). On the other hand, the source planes SP of other memory layers where unselected memory cells exist are kept a floating (F).

SUMMARY OF THE INVENTION

Incidentally, the gates of every two memory cells aligned in a direction parallel with the drain plane DP of each memory layer are connected to different word lines. However, these memory cells are connected to the same source line and the same bit line. Therefore, a bias is applied between the source line and bit line of an unselected memory cell, which is likely to cause leakage current flowing through the unselected memory cell.

That is, in every two memory cells aligned in a direction parallel with the drain plane DP, only their gate terminals are connected to different word lines. Therefore, a leakage current flows in the unselected one of the two memory cells. The cause of this is that a memory cell is determined to be "unselected" by differentiating the value of gate voltage.

The present invention has been made taking account of the above situation and a primary object of the invention is therefore to provide a nonvolatile storage device and a bias control method thereof which are capable of reducing leakage current in unselected memory cells by properly supplying a bias voltage to the source lines connected to the source terminals of the memory cells.

According to a first aspect of the invention, there is provided a nonvolatile storage device having a memory cell array composed of a plurality of memory cells, the memory cell array having: a bit line to which the drain terminals of the plurality of memory cells having noncovalent connected gate terminals are commonly connected; a source line to which the source terminals of the plurality of memory cells having commonly connected gate terminals are commonly connected and which extend perpendicularly to the bit line; and a first source selector switch for connecting the source line to a source bias line.

In the nonvolatile storage device according to the first aspect of the invention, a bit line to which the drain terminals of a plurality of memory cells having noncovalent connected gate terminals are commonly connected; a source line to which the source terminals of a plurality of memory cells having commonly connected gate terminals are commonly connected and which extends perpendicularly to the bit line; and a first source selector switch for connecting the source line to a source bias line are selected and the source line is connected to the source bias line, whereby the memory cell to be selected by biasing both the drain terminal and the source terminal can be limited to the memory cell located at a position where the source line and the bit line intersect. As to unselected memory cells that are not connected to the source bias line, no bias is applied between the source terminal not connected to the source bias line and the drain terminal, irrespective of the presence/absence of bias applied to the drain terminal. Therefore, in the nonvolatile storage device of the first aspect, a flow of leakage current is suppressed in unselected memory cells to which no bias is applied.

According to a second aspect of the invention, there is provided the nonvolatile storage device according to the first aspect, wherein the memory cell array has a plurality of said first source selector switches and the plurality of first source selector switches are individually connected to the source bias line.

According the second aspect of the invention, since the plurality of first source selector switches are respectively connected to one source bias line, the number of source lines to be connected to a source bias line can be cut to a bare minimum by controlling the number of first source selector switches to be brought into a conducting state. In this arrangement, the source lines connected to the first source selector switches in a non-conducting state are not connected to the source bias line. In the second aspect, by virtue of a minimized number of source lines connected to the source bias line, the number of memory cells to be selected can be minimized which leads to suppression of a flow of leakage current.

According to an eighteenth aspect of the invention, there is provided a bias control method for a nonvolatile storage device having a memory cell array composed of a plurality of memory cells, the method comprising: a bit line biasing step for biasing a bit line to which the drain terminals of the plurality of memory cells having noncovalent connected gate terminals are commonly connected; and a source line biasing step for biasing a source line to which the source terminals of the plurality of memory cells having commonly connected gate terminals are commonly connected and which extend perpendicularly to the bit line.

In the nonvolatile storage device bias control method according to the eighteenth aspect of the invention, a bit line to which the drain terminals of a plurality of memory cells having noncovalent connected gate terminals are commonly connected is biased while biasing a source line to which the source terminals of a plurality of memory cells having commonly connected gate terminals are commonly connected and which extends perpendicularly to the bit line, whereby the memory cell to be selected by biasing both the drain terminal and the source terminal can be limited to the memory cell located at a position where the source line and the bit line intersect. As to unselected memory cells connected to source lines to which no bias is applied, no bias is applied between the source terminal connected to the source line to which no bias is applied and the drain terminal, irrespective of the presence/absence of bias applied to the bit line. Therefore, in the nonvolatile storage device bias control method of the eighteenth aspect, a flow of leakage current is suppressed in unselected memory cells to which no bias is applied.

In the nonvolatile storage device and bias control method thereof according to the invention, the memory cell to be selected by biasing both the drain terminal and source terminal can be limited to the position where the source line and the bit line intersect, by biasing a bit line to which the drain terminals of a plurality of memory cells having noncovalent connected gate terminals are commonly connected and biasing a source line to which the source terminals of a plurality of memory cells having commonly connected gate terminals are commonly connected and which extends perpendicularly to the bit line. As to unselected memory cells connected to source lines to which no bias is applied, no bias is applied between the source terminal connected to the source line to which no bias is applied and the drain terminal, irrespective of the presence/absence of bias applied to the bit line. Therefore, in the nonvolatile storage device and its bias control method of the invention, a flow of leakage current is suppressed in unselected memory cells to which no bias is applied.

DETAILED DESCRIPTION OF THE INVENTION

The present invention will now be described in detail with reference to a various embodiments thereof as illustrated in the accompanying drawings. In the following description, specific details are set forth in order to provide a thorough understanding of the present invention. It will be apparent, however, to one skilled in the art, that the present invention may be practiced without using some of the implementation details set forth herein. It should also be understood that well known operations have not been described in detail in order to not unnecessarily obscure the present invention.

EXEMPLARY EMBODIMENTS OF NONVOLATILE STORAGE DEVICE AND BIAS CONTROL METHOD THEREOF

First Exemplary Embodiment

Figure 1:
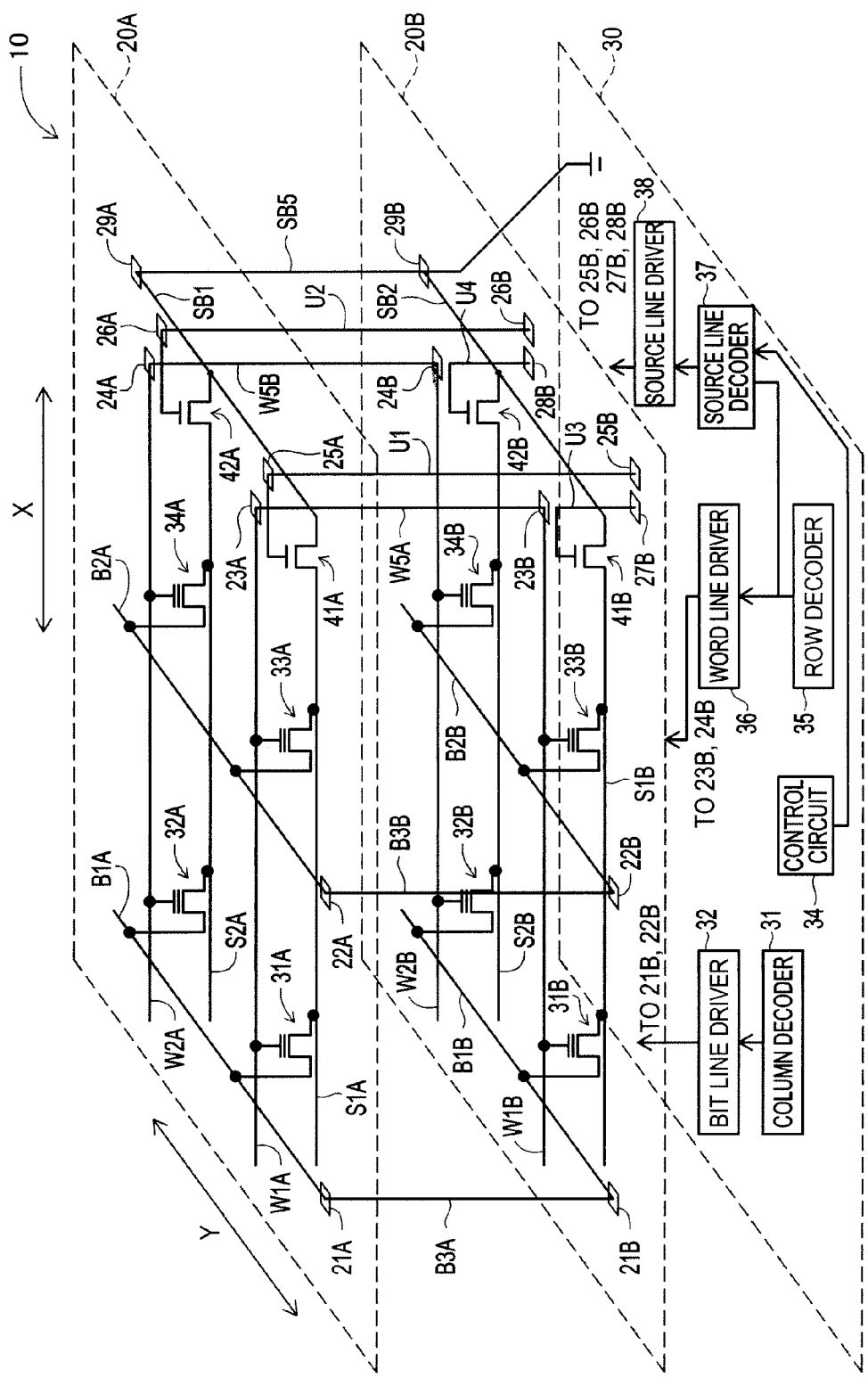
FIG. 1 is a schematic circuit diagram of a three-dimensional memory according to a first embodiment.

Referring now to FIG. 1, a first embodiment of the invention will be described. Herein, the three-dimensional nonvolatile storage device of the invention will be explained by way of a three-dimensional memory. FIG. 1 is a schematic circuit diagram of a three-dimensional memory 10. The three-dimensional memory 10 has two memory cell arrays 20A, 20B and a silicon wafer 30 that serves as a substrate for driving the memory cell arrays. FIG. 1 shows an embodiment where the two memory cell arrays 20A, 20B are disposed on the silicon wafer 30. The memory cell arrays 20A, 20B are arranged in each lamination layer. The memory cell arrays 20A, 20B and the silicon wafer 30 constitute a memory cell array block. Mounted on the silicon wafer 30 are a driving circuit (described later) for driving the memory cell arrays 20A, 20B and components having other functions than the memory function such as logic IC, ASIC and MPU (not shown in the drawing). The silicon wafer 30 and the memory cell arrays 20A, 20B are manufactured in a single unitary manufacturing process. The total memory capacity of the three-dimensional memory 10 varies depending on the number of stacked memory arrays. In this embodiment, a bit line driver 32, a word line driver 36 and a source line driver 38 respectively correspond to the driving circuit of the invention.

The memory cell array 20A has memory transistors 31A, 32A, 33A, 34A, bit lines B1A, B2A, source lines S1A, S2A, word lines W1A, W2A, and selection transistors 41A, 42A. In this embodiment, the memory transistors 31A to 34A each consist of a thin film transistor (TFT). The memory transistors 31A to 34A correspond to the memory cells of the invention. Also, the selection transistors 41A, 42A each consist of a thin film transistor (TFT). The memory transistors and the selection transistors are manufactured by the same manufacturing process except the storage section. The driving circuit of the silicon wafer 30 is constructed by, for instance, an MOS transistor. Layered signal lines (such as B3A, W5A, U1, SB5), which interconnect the silicon wafer 30 (corresponding to the substrate) with the memory cell arrays 20A, 20B, plug-connect contacts (e.g., 29A and 29B) by use of tungsten in the same manufacturing process stated above. The memory cell array 20B, for instance, may be manufactured in the same manufacturing process as of the silicon wafer 30. That is, the memory cell array 20B is incorporated into the silicon wafer 30. In this case, the memory transistors and the transistors of the substrate have the same device structure except the storage section. The memory cell array 20A is laid over the silicon wafer 30. The configuration in which the memory cell array 20B is incorporated into the silicon wafer 30 is applicable not only to the first embodiment but also to the second to fourth embodiments (described later).

The bit lines B1A, B2A are aligned with a specified spacing in a lateral direction (X direction in the drawing) of the memory cell array 20A so as to extend in a longitudinal direction (Y direction in the drawing) of the memory cell array 20A. The source lines S1A, S2A are aligned with a specified spacing in the longitudinal direction (Y direction in the drawing) of the memory cell array 20A so as to extend in the lateral direction (X direction in the drawing) of the memory cell array 20A. The extending direction of the source lines S1A, S2A (X direction) is 90 degrees away from the extending direction of the bit lines B1A, B2A (Y direction). The longitudinal direction (Y direction) of the memory cell array 20A corresponds to the first direction of the invention. The lateral direction (X direction) of the memory cell array 20A corresponds to the second direction of the invention.

The word lines W1A, W2A are aligned with a specified spacing in the longitudinal direction (Y direction in the drawing) of the memory cell array 20A so as to extend in the lateral direction (X direction in the drawing) of the memory cell array 20A, but are located at positions different from the positions of the source lines S1A, S2A.

The bit line B1A is connected to the drain electrodes of the memory transistors 31A, 32A. The source electrode of the memory transistor 31A is connected to the source line S1A. The gate electrode of the memory transistor 31A is connected to the word line W1A. The source electrode of the memory transistor 32A is connected to the source line S2A. The gate electrode of the memory transistor 32A is connected to the word line W2A.

The bit line B2A is connected to the drain electrodes of the memory transistors 33A, 34A. The source electrode of the memory transistor 33A is connected to the source line S1A, similarly to the source electrode of the memory transistor 31A. The gate electrode of the memory transistor 33A is connected to the word line W1A, similarly to the gate electrode of the memory transistor 31A. The source electrode of the memory transistor 34A is connected to the source line S2A, similarly to the source electrode of the memory transistor 32A. The gate electrode of the memory transistor 34A is connected to the word line W2A, similarly to the gate electrode of the memory transistor 32A.

The drain electrode of the selection transistor 41A is connected to the source line S1A. The source electrode of the selection transistor 41A is connected to one end of a source bias line SB1. The other end of the source bias line SB1 is connected to the ground of the silicon wafer 30 through a contact 29A of the memory cell array 20A, a vertical source bias line SB5 connected to the contact 29A, and a contact 29B of the memory cell array 20B connected to the source bias line SB5. The selection transistor 41A corresponds to the first source selector switch of the invention. The vertical source bias line SB5 corresponds to the first layered source bias line of the invention.

The drain electrode of the selection transistor 42A is connected to the source line S2A. The source electrode of the selection transistor 42A is connected between one end and the other end of the source bias line SB1. Thereby, the source electrode of the selection transistor 42A is connected to the source bias line SB1 together with the source electrode of the selection transistor 41A. The selection transistor 42A corresponds to the first source selector switch of the invention.

The memory cell array 20B has memory transistors 31B, 32B, 33B, 34B, bit lines B1B, B2B, source lines S1B, S2B, word lines W1B, W2B, and selection transistors 41B, 42B. The memory transistors 31B to 34B each consist of a thin film transistor (TFT), like the memory transistors 31A to 34A. The selection transistors 41B, 42B each consist of a thin film transistor (TFT), like the selection transistors 41A, 42A. The memory transistors 31B to 34B correspond to the memory cells of the invention.

The bit lines B1B, B2B are aligned with a specified spacing in a lateral direction (X direction in the drawing) of the memory cell array 20B so as to extend in a longitudinal direction (Y direction in the drawing) of the memory cell array 20B. The source lines S1B, S2B are aligned with a specified spacing in the longitudinal direction (Y direction in the drawing) of the memory cell array 20B so as to extend in the lateral direction (X direction in the drawing) of the memory cell array 20B. The extending direction of the source lines S1B, S2B (X direction) is 90 degrees away from the extending direction of the bit lines B1B, B2B (Y direction). The longitudinal direction (Y direction) of the memory cell array 20B corresponds to the first direction of the invention. The lateral direction (X direction) of the memory cell array 20B corresponds to the second direction of the invention.

The word lines W1B, W2B are aligned with a specified spacing in the longitudinal direction (Y direction in the drawing) of the memory cell array 20B so as to extend in the lateral direction (X direction in the drawing) of the memory cell array 20B but are located at positions different from the positions of the source lines S1B, S2B.

The bit line B1B is connected to the drain electrodes of the memory transistors 31B, 32B. The source electrode of the memory transistor 31B is connected to the source line S1B. The gate electrode of the memory transistor 31B is connected to the word line W1B. The source electrode of the memory transistor 32B is connected to the source line S2B. The gate electrode of the memory transistor 32B is connected to the word line W2B.

The bit line B2B is connected to the drain electrodes of the memory transistors 33B, 34B. The source electrode of the memory transistor 33B is connected to the source line S1B, similarly to the source electrode of the memory transistor 31B. The gate electrode of the memory transistor 33B is connected to the word line W1B, similarly to the gate electrode of the memory transistor 31B. The source electrode of the memory transistor 34B is connected to the source line S2B, similarly to the source electrode of the memory transistor 32B. The gate electrode of the memory transistor 34B is connected to the word line W2B, similarly to the gate electrode of the memory transistor 32B.

The drain electrode of the selection transistor 41B is connected to the source line S1B. The source electrode of the selection transistor 41B is connected to one end of a source bias line SB2. The other end of the source bias line SB2 is connected to the ground of the silicon wafer 30 through the contact 29B. The selection transistor 41B corresponds to the first source selector switch of the invention.

The drain electrode of the selection transistor 42B is connected to the source line S2B. The source electrode of the selection transistor 42B is connected between one end and the other end of the source bias line SB2. The selection transistor 42B corresponds to the first source selector switch of the invention.

The bit line B1A is connected to the bit line B1B through a contact 21A of the memory cell array 20A by a vertical bit line B3A. The bit line B2A is connected to the bit line B2B through a contact 22A of the memory cell array 20A by a vertical bit line B3B. The vertical bit lines B3A, B3B are arranged perpendicularly to the plate surfaces of the memory cell arrays 20A, 20B. The vertical bit lines B3A, B3B correspond to the interlayer bit lines of the invention.

The word line W1A is connected to the word line W1B through a contact 23A of the memory cell array 20A by the vertical word line W5A. The word line W2A is connected to the word line W2B through a contact 24A of the memory cell array 20A by a vertical word line W5B. The vertical word lines W5A, W5B are arranged perpendicularly to the plate surfaces of the memory cell arrays 20A, 20B. The vertical word lines W5A, W5B correspond to the interlayer word lines of the invention.

Arranged in the silicon wafer 30 are a column decoder 31 that is a driving circuit for driving the memory cell arrays 20A, 20B; a bit line driver 32; a control circuit 34; a row decoder 35; a word line driver 36; a source line decoder 37; and a source line driver 38. The external power source voltage supplied from the outside of the three-dimensional memory 10 is, for instance, 3V The control circuit 34 and the above decoders operate at 3V The above drivers operate with a stepped-up voltage produced by increasing the external power source voltage by an internal voltage step-up circuit (not shown) in accordance with a write mode or read mode. The row decoder 35 corresponds to the first decoder of the invention. The source line decoder 37 corresponds to the second decoder of the invention.

Connected to the column decoder 31 is the bit line driver 32. The vertical bit line B3A is connected to the bit line driver 32 through a contact 21B of the memory cell array 20B. In addition, the vertical bit line B3B is connected to the bit line driver 32 through a contact 22B of the memory cell array 20B.

Connected to the row decoder 35 is the word line driver 36. The vertical word line W5A is connected to the word line driver 36 through a contact 23B of the memory cell array 20B. In addition, the vertical bit line W5B is connected to the word line driver 36 through a contact 24B of the memory cell array 20B.

Connected to the raw decoder 35 is the source line decoder 37. The source line decoder 37 is connected to the source line driver 38. The gate electrode of the selection transistor 41A is connected to the source line driver 38 through a contact 25B of the memory cell array 20B, a selection line U1 and a contact 25A of the memory cell array 20A. The gate electrode of the selection transistor 42A is connected to the source line driver 38 through a contact 26B of the memory cell array 20B, a selection line U2 and a contact 26A of the memory cell array 20A. The selection lines U1, U2 correspond to the second switch selection line and third switch selection line, respectively, of the invention.

Further, the gate electrode of the selection transistor 41B is connected to the source line driver 38 through a contact 27B of the memory cell array 20B and a selection line U3. The gate electrode of the selection transistor 42B is connected to the source line driver 38 through a contact 28B of the memory cell array 20B and a selection line U4. The selection lines U3, U4 correspond to the first switch selection lines of the invention.

Next, the operation of the three-dimensional memory 10 of the first embodiment will be described. For example, the three-dimensional memory 10 operates as follows during data write operation for writing data into the memory transistor 31A.

In the three-dimensional memory 10, an m-bit address signal is fed to an address buffer (not shown). The address buffer sends a column address signal to the column decoder 31 and a row address signal to the row decoder 35.

The column decoder 31 decodes a column address based on a received column address signal and operates the bit line driver 32 in accordance with this column address. Herein, the bit line driver 32 selects the vertical bit line B3A connected to the drain electrode of the memory transistor 31A. The bit line driver 32 applies a high positive voltage (e.g., 5V) to the bit lines B1A, BIB connected to the vertical bit line B3A, through the vertical bit line B3A.

The row decoder 35 decodes a row address based on a received row address signal and operates the word line driver 36 in accordance with this row address. Herein, the word line driver 36 selects the vertical word line W5A connected to the gate electrode of the memory transistor 31A. The word line driver 36 applies a high positive voltage (e.g., 10V) to the word lines W1A, W1B connected to the vertical word line W5A through the vertical word line W5A.

The source decoder 37 is supplied with the row address decoded from the row decoder 35. The source decoder 37 is also supplied with a memory cell array selection signal from the control circuit 34. The source decoder 37 executes decoding based on the memory cell array selection signal as well as the row address.

The source line decoder 37 decodes the position (row address) of a selection transistor based on the row address and the memory cell array selection signal and operates the source line driver 38 in accordance with the row address. Herein, the source line driver 38 selects the selection line U1 connected to the gate electrode of the selection transistor 41A. The source line driver 38 applies a voltage to the gate electrode of the selection transistor 41A through the selection line U1 so as to turn the transistor 41A ON.

Figure 2:
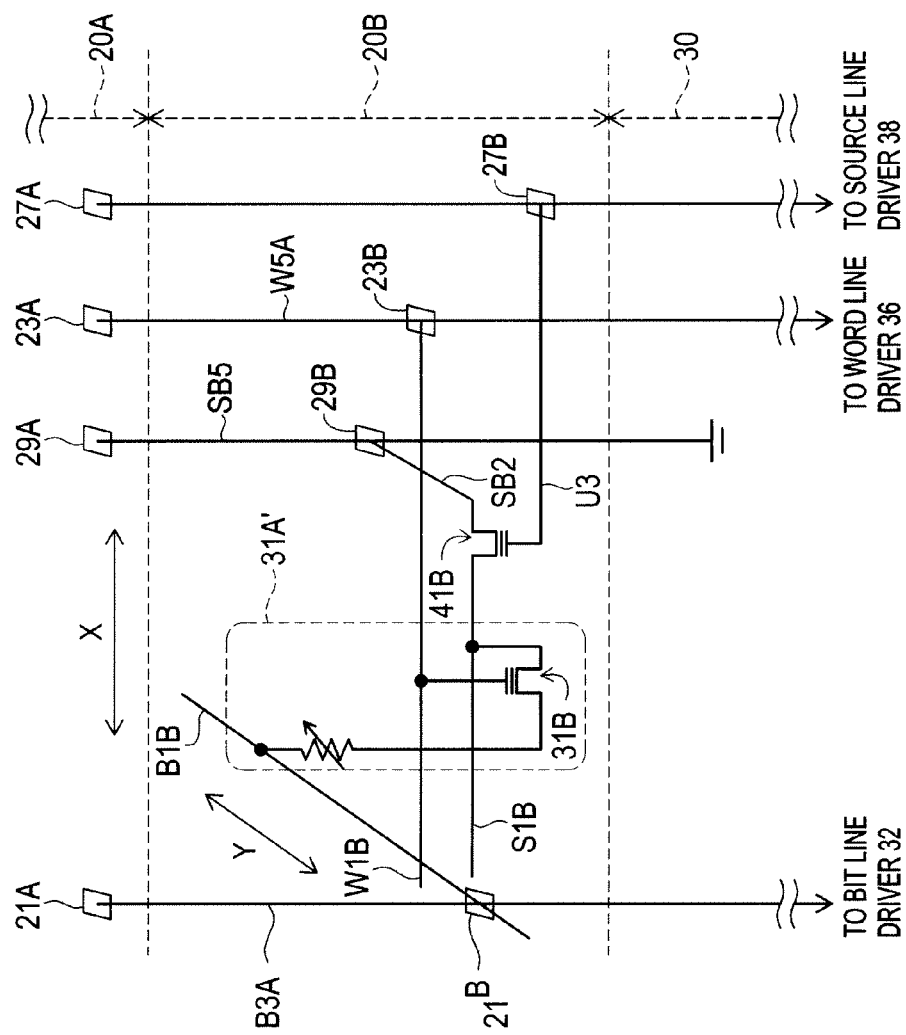
FIG. 2 is a schematic circuit diagram that includes memory cells provided in a three-dimensional memory in which two memory cell arrays are stacked.

After the selection transistor 41A has been turned ON, the source line S1A is connected to the ground through the transistor 41A, the source bias line SB1 and the vertical source bias line SB5. In this embodiment, after a high positive voltage has been applied to the bit line B1A and the word line W1A as described earlier, a high electric field is generated at the drain electrode of the memory transistor 31A located at the position where the bit line B1A and the word line W1A intersect and hot electron is injected into the floating gate of the memory transistor 31A. Accordingly, the operation of writing data into the memory transistor 31A is performed. It should be noted that the memory transistors may take various device structures. The memory transistors may be configured such that a storage section is integral with or separated from a transistor for selecting the storage section. One example of the memory transistors in which the storage section is integral with the transistor is TFT type transistors having a floating gate that serves as the storage section. The TFT type transistors are such that the floating gate is additionally disposed on the channel between the source and the drain or such that the side wall of the control gate serves as the floating gate. Another example of the memory transistors of the integral type is TFT type transistors having a storage section made from a nitride film or the like. Examples of the memory transistors of the separated type in which the storage section is separated from the transistor include: memories in which the storage section has the MIM (Metal Insulator Metal) structure; RRAM cell 31A' (see FIG. 2); PRAM; and MRAM or the like. It should be noted that, as illustrated in FIG. 2, the layered signal lines (B3A, W5A, SB5 etc.) for interconnecting the memory cell array 20B and the memory cell array 20A plug-connect the contacts (e.g., the contact 29A and the contact 29B) by use of tungsten such that the distance between the contacts becomes equivalent to the height of the RRAM cell 31A'. Alternatively, an insulating film may be provided between the memory cell array 20B and the memory cell array 20A such that the plug-thickness corresponds to the insulating film.

Regarding the memory transistor 32A the drain electrode of which is connected to the bit line B1A and the memory transistor 34A, the selection transistor 42A, connectable to the ground through the source bias line SB1 and the vertical source bias line SB5, is kept in its OFF state, and the source line S2A connected to the source electrodes of the memory transistors 32A, 34A is not connected to the ground through the selection transistor 42A. Therefore, the source line S2A is kept floating. The word line W2A of the memory transistor 32A is inactive so that a current path for a leakage current flowing from the bit line B1A is not formed even if the memory cell 32A is such a transistor that causes a leakage current. The memory cell transistor 34A has the same conditions as of the memory cell transistor 32A and its bit line B2A is unselected so that a leakage current path is not formed.

Regarding the memory transistor 33A having the source electrode connected to the source line S1A, no high positive voltage is applied to the bit line B2A connected to the drain electrode of the transistor 33A. Therefore, no leakage current path is formed in the memory cell transistor 33A, because the bit line B2A is unselected even when the word line W1A is selected, and because the drain terminal and source terminal of the memory cell transistor 33A have low potentials.

Regarding the memory transistors 31B, 33B, during operation for writing data into the memory transistor 31A, the selection transistor 41B, connectable to the ground through the source bias line SB2, is kept in its OFF state, and the source line S1B connected to the source electrodes of the memory transistors 31B, 33B is not connected to the ground through the selection transistor 41B. Therefore, writing of data into the memory transistors 31B, 33B is not performed.

Regarding the memory transistors 32B, 34B, the selection transistor 42, connectable to the ground through the source bias line SB2, is kept in its OFF state, and the source line S2B connected to the source electrodes of the memory transistors 32B, 34B is not connected to the ground through the selection transistor 42B. In addition, the word line W2B is unselected. Therefore, writing of data into the memory transistors 32B, 34B is not performed.

The three-dimensional memory 10 operates as follows during data read operation for reading data from the memory transistor 31A. Herein, an explanation on the same processes as of the foregoing data write operation is omitted.

The bit line driver 32 selects the vertical bit line B3A connected to the drain electrode of the memory transistor 31A according to a column address supplied from the column decoder 31. The bit line driver 32 applies a positive voltage (a voltage (e.g., 2V) lower than 5V) to the bit lines B1A, B1B connected to the bit line B3A, through the vertical bit line B3A. Application of a positive voltage to the bit lines B1A, B1B corresponds to the bit line biasing step of the invention.

The word line driver 36 selects the vertical word line W5A connected to the gate electrode of the memory transistor 31A according to a row address supplied from the row decoder 35. The word line driver 36 applies a positive voltage (a voltage (e.g., 4V) lower than 5V) to the word lines W1A, W1B connected to the vertical word line W5A, through the vertical word line W5A.

The source line driver 38 selects the selection line U1 connected to the gate electrode of the selection transistor 41A according to a row address decoded by the source line decoder 37. The source line driver 38 applies such a voltage that turns the selection transistor 41A ON to the gate electrode of the selection transistor 41A through the selection line U1. This makes the source line S1A connected to the ground through the selection transistor 41A, the source bias line SB1 and the vertical source bias line SB5. The connection of the source line S1A to the ground through the selection transistor 41A, the source bias line SB1 and the vertical source bias line SB5 correspond to the source line biasing step and the single source line biasing step of the invention.

If a current flows into the memory transistor 31A in a condition that the source line S1A is connected to the ground and a positive voltage is applied to the bit line B1A and the word line W1A, it is then determined that no electrons are injected into the floating gate of the transistor 31A and read data "1" is identified.

If no current flows into the memory transistor 31A in a condition that the source line S1A is connected to the ground and a positive voltage is applied to the bit line B1A and the word line W1A, it is then determined that electrons have been accumulated in the floating gate of the transistor 31A and the threshold voltage is high. And, read data "0" is identified.

Regarding the memory transistor 32A the drain electrode of which is connected to the bit line B1A, the selection transistor 42A, connectable to the ground through the source bias line SB1 and the vertical source bias line SB5, is kept in its OFF state, and the source line S2A connected to the source electrode of the memory transistor 32A is not connected to the ground through the selection transistor 42A.

In the above memory transistor 32A, an excessive erase condition sometimes occurs during erase operation for erasing data written in the transistor 32A, which causes a depletion condition. Even in such a case, the source line S2A connected to the source electrode of the memory transistor 32A is not connected to the ground through the selection transistor 42A as discussed earlier. Therefore, even if a voltage is applied to the bit line B1A, a flow of leakage current from the drain electrode of the memory transistor 32A connected to the bit line B1A to the source electrode of the transistor 32A is restrained.

According to the first embodiment, a positive voltage is not applied to the bit line B2A connected to the drain electrode of the memory transistor 33A the source electrode of which is connected to the source line S1A.

Regarding the memory transistor 33A, even when a positive voltage is applied to the word line W1A, a positive voltage is not applied to the bit line B2A connected to the drain electrode of the transistor 33A. Therefore, a flow of leakage current from the drain electrode of the memory transistor 33A connected to the bit line B2A to the source electrode of the transistor 33A is restrained.

Although a depletion condition sometimes arises in the memory transistor 34A, the source line S2A connected to the source electrode of the memory transistor 34A is not connected to the ground through the selection transistor 42A. In addition, a positive voltage is not applied to the bit line B2A connected to the drain electrode of the memory transistor 34A. As a result, a flow of leakage current from the drain electrode to the source electrode is restrained in the memory transistor 34A.

Regarding the memory transistors 31B, 33B in this embodiment, the selection transistor 41B, connectable to the ground by the source bias line SB2, is kept in its OFF state during read operation for reading data from the memory transistor 31A, and the source line S1B connected to the source electrodes of the memory transistors 31B, 33B is not connected to the ground through the selection transistor 41B. In addition, a positive voltage is not applied to the bit line B2B connected to the drain electrode of the memory transistor 33B.

Even if a depletion condition arises in the memory transistor 31B, the source line S1B, connected to the source electrode of the transistor 31B, is not connected to the ground. Therefore, a flow of leakage current from the drain electrode to the source electrode in the transistor 31B is restrained even when a positive voltage is applied to the bit line B1B connected to the drain electrode of the transistor 31B. Further, since a positive voltage is not applied to the bit line B2B, a flow of leakage current from the drain electrode to the source electrode in the transistor 33B is restrained.

Regarding the memory transistors 32B, 34B, the selection transistor 42B, connectable to the ground by the source bias line SB2, is kept in its OFF state, and the source line S2B connected to the source electrodes of the memory transistors 32B, 34B is not connected to the ground through the selection transistor 42B. In addition, a positive voltage is not applied to the bit line B2B connected to the drain electrode of the memory transistor 34B.

Even if a depletion state arises in the memory transistor 32B, the source line S2B, connected to the source electrode of the transistor 32B, is not connected to the ground. Therefore, a flow of leakage current from the drain electrode to the source electrode in the transistor 32B is restrained even when a positive voltage is applied to the bit line B1B connected to the drain electrode of the transistor 32B. Additionally, even if a depletion state arises in the memory transistor 34B, a positive voltage is not applied to the bit line B2B connected to the drain electrode of the memory transistor 34B and therefore a flow of leakage current from the drain electrode to the source electrode in the transistor 34B is restrained.

Effects of First Exemplary Embodiment

As illustrated in FIG. 1, in the memory cell array 20A of the three-dimensional memory 10 of the first embodiment, the extending direction of the source line S1A, to which the source electrodes of the memory transistors 31A, 33A are commonly connected, is 90 degrees away from the bit lines B1A, B2A connected to the drain electrodes of the memory transistors 31A, 33A, respectively. The selection transistors 41A, 42A for the source lines S1A, S2A are turned ON to connect the source lines S1A, S2A to the source bias line SB1. Thereby, during data read operation in the three-dimensional memory 10, the memory transistor in which a positive voltage is applied to the drain electrode through the bit line B1A and the source electrode is connected to the ground through the source line S1A, the selection transistor 41A, the source bias line SB1 and the vertical source bias line SB5 is only the memory transistor 31A located at the intersection of the source line S1A and the bit line B1A. For instance, even if a positive voltage is applied to the bit line B1A when the unselected memory transistor 32A is in a depletion state, a flow of leakage current can be restrained because the source electrode of the transistor 32A is not connected to the ground. According to the three-dimensional memory 10 of the first embodiment, the restraint on a flow of leakage current enables it to inhibit drops in the potential of the bit line B1A even in cases where many unselected memory transistors are connected to the bit line B1A. As a result, in the three-dimensional memory 10, it becomes possible to restrain such an undesirable situation that the potential of the bit line B1A drops, causing a data read error.

In the three-dimensional memory 10 of the first embodiment, the memory cell array 20A, for instance, is configured such that the source lines S1A, S2A are connectable to the ground through the source bias line SB1 and the vertical source bias line SB5 by the selective transistors 41A, 42A respectively, as illustrated in FIG. 1. Therefore, a source line to be connected to the ground can be determined by controlling the ON/OFF state of the selection transistors 41A, 42A. For instance, when turning the selection transistor 41A ON and connecting the source line S1A connected to the source electrode of the memory transistor 31A to the ground in order to read data from the memory transistor 31A, the source line S2A connected to the unselected memory transistors 32A, 34A are not connected to the ground. This reduces the possibility that the source line connected to the source electrodes of the unselected memory transistors is connected to the ground. In the three-dimensional memory 10 of the first embodiment, since the possibility that the source line connected to the source electrodes of unselected memory transistors is connected to the ground is thus restricted, a flow of leakage current from the drain electrode to the source electrode in unselected memory transistors can be restrained even if the a depletion condition arises in the unselected memory transistors. In the memory cell array 20A, the source bias line SB1 is common to all the selection transistors 41A, 42A. In addition, in the memory cell array 20B, the source bias line SB2 is commonly connected to all the selection transistors 41B, 42B. Therefore, there is no need to connect a different source bias line to every selection transistor in the three-dimensional memory 10 and thus, the number of source bias lines can be reduced compared to cases where a source bias line is connected to every selection transistor. In the three-dimensional memory 10 of the first embodiment, the area occupied by source bias lines can be reduced by reducing the number of source bias lines.

In the three-dimensional memory 10 of the first embodiment, the memory cell array 20B is laid over the silicon wafer 30. In the three-dimension memory 10, the source bias line SB2 is connected to the ground of the silicon wafer 30 through the contact 29B by the vertical source bias line SB5. In the three-dimensional memory 10, the source line driver 38 provided in the silicon wafer 30 and the gate of the selection transistor 41A are connected to each other through the contacts 25A, 25B by the selection line U1, whereas the source line driver 38 provided in the silicon wafer 30 and the gate of the selection transistor 42A are connected to each other through the contacts 26A, 26B by the selection line U2. The source line driver 38 is further connected to the gate of the selection transistor 41B through the contact 27B by the selection line U3. The source line driver 38 is further connected to the gate of the selection line driver 42B through the contact 28B by the selection line U4. The vertical source bias line SB5 is perpendicular to the contact 29B as well as to the plate surface of the silicon wafer 30 and provides wiring that runs in the shortest route between the contact 29B and the ground of the silicon wafer 30. This leads to noise reduction and high speed processing. In addition, the source bias line SB2 is connected to the ground of the silicon wafer 30 by the vertical source bias line SB5, so that the layout of the wiring pattern for connecting the source bias line SB2 to the ground can be simplified. Additionally, in this embodiment, the selection line U3 is perpendicular to the contact 27B as well as to the plate surface of the silicon wafer 30 and provides wiring that runs in the shortest route between the contact 27B and the source line driver 38 of the silicon wafer 30, so that noise reduction and high speed processing are enabled. The selection line U4 is perpendicular to the contact 28B as well as to the plate surface of the silicon wafer 30 and provides wiring that runs in the shortest route between the contact 28B and the source line driver 38 of the silicon wafer 30, which also enables noise reduction and high speed processing.

In the three-dimensional memory 10 of the first embodiment, MPU, ASIC etc., which are produced in the same manufacturing process as of the memory cell arrays 20A, 20B, are mounted on the silicon wafer 30. Therefore, in the three-dimensional memory 10, MPU, ASIC etc. are mounted in addition to the decoder 31, driver 32 etc, thereby imparting high functionality to the device. By controlling the decoder 31 etc. according to the result of arithmetic operation performed by MPU or ASIC, high-speed processing of memory data is enabled. Setting for MPU, ASIC etc. can be done according to customers' usage.

In the three-dimensional memory 10 of the first embodiment, the memory cell arrays 20A and 20B are arranged in layers on the silicon wafer 30. The source bias line SB1 is connected to the source bias line SB2 through the contacts 29A, 29B by the vertical source bias line SB5. The source line driver 38 provided in the silicon wafer 30 and the gate of the selection transistor 41A are connected to each other through the contacts 25A, 25B by the selection line U1. Further, the source line driver 38 and the gate of the selection transistor 42A are connected to each other through the contacts 26A, 26B by the selection line U2. In the first embodiment, the vertical source bias line SB5 is perpendicular to the contacts 29A, 29B and provides wiring that runs in the shortest route between the contact 29A and the contact 29B. This leads to noise reduction and high speed processing. In addition, the source bias line SB1 is connected to the source bias line SB2 by the vertical source bias line SB5, so that the layout of the wiring pattern for connecting the source bias lines SB1 and SB2 to each other can be simplified. Additionally, the selection line U1 is perpendicular to the contacts 25A, 25B and provides wiring that runs in the shortest route between the contacts 25A, 25B, which enables noise reduction and high speed processing. Also, the selection line U2 is perpendicular to the contacts 26A, 26B and provides wiring that runs in the shortest route between the contacts 26A, 26B, which enables noise reduction and high speed processing. In the first embodiment, the source line driver 38 is connected to the gate of the selection transistor 41A by the selection line U1 and connected to the gate of the selection transistor 42A by the selection line U2, whereby the layout of the wiring pattern connecting the selection line U1 to the source line driver 38 and the layout of the wiring pattern connecting the selection line U2 to the source line driver 38 are simplified.

In the three-dimensional memory 10 of the first embodiment, the word lines W1A, W2A formed in the memory cell array 20A are parallel with the source lines S1A, S2A formed in the memory cell array 20A. The word lines W1B, W2B formed in the memory cell array 20B are parallel with the source lines S1B, S2B formed in the memory cell array 20B. Therefore, the length of each of the memory cell arrays 20A, 20B in the Y direction can be controlled by adjusting the spacing between the word lines and the source lines in the Y direction.

As discussed earlier, in the three-dimensional memory 10 of the first embodiment, a row address decoded by the row decoder 35 is used for bringing the selection transistor 41A disposed in the memory cell array 20A into its ON state. According to the three-dimensional memory 10 of the first embodiment, in cases where a row address decoded by the row decoder 35 is used for turning the selection transistor 41A ON, for reading data from, for instance, the memory transistor 31A, the source line S1A connected to the source electrode of the transistor 31A can be selected in correspondence with the word line W1A to which the gate electrode of the transistor 31A is connected. Therefore, the memory transistor 31A that is a target memory from which data is to be read out can be easily pointed out by selecting the source line S1A in correspondence with the word line W1A.

As discussed earlier, in the three-dimensional memory 10 of the first embodiment, when the word line driver 36 applies a positive voltage to the word lines W1A, W1B in accordance with the row address supplied from the row decoder 35, the source line driver 38 applies a voltage to the gate electrode of the selection transistor 41A to turn on the transistor 41A, according to the row address decoded by the source line decoder 37 based on the row address and the memory cell array selection signal. More specifically, based on the row address supplied from the row decoder 35 and the row address decoded by the source line decoder 37, the selective transistor 41A for the source line S1A corresponding to the word line W1A is turned ON while the selective transistor 41B for the source line S1B corresponding to the word line W1B is OFF.

Thus, the selection transistor 41A, which can connect the source line S1A to the ground, can be turned ON, the source line S1A being connected to the memory transistor 31A that is a target memory from which data is to be read out. On the other hand, the selection transistor 41B, which can connect the source line S1B connected to the unselected memory transistors 31B, 33B to the ground, can be kept in its OFF state, so that a flow of leakage current into the unselected memory transistors 31B, 33B can be restrained.

As discussed earlier, in the three-dimensional memory 10 of the first embodiment, in cases where the memory cell array 20B is incorporated into the silicon wafer 30, the source bias line SB1 of the memory cell array 20A is connected to the ground of the silicon wafer 30 through the contacts 29A, 29B by the vertical source bias line SB5. In the three-dimensional memory 10, the vertical source bias line SB5 is perpendicular to the contacts 29A, 29B and provides wiring that runs in the shortest route between the contacts 29A and 29B, so that noise reduction and high speed processing become possible. In addition, the source bias line SB1 is connected to the ground of the silicon wafer 30 by the vertical source bias line SB5, so that the layout of the wiring pattern for connecting the source bias line SB1 to the ground of the silicon wafer 30 can be simplified. It should be noted that the memory cell array 20B incorporated into the silicon wafer 30 corresponds to the substrate-integrated memory cell array of the invention. In the first embodiment, the source line driver 38 is connected to the gate of the selection transistor 41A through the contact 25A by the selection line U1 and connected to the gate of the selection transistor 42A through the contact 26A by the selection line U2. In the three-dimensional memory 10, the selection line U1 is perpendicular to the contact 25B as well as to the plate surface of the silicon wafer 30 and provides wiring that runs in the shortest route between the contact 25B and the source line driver 38 of the silicon wafer 30, so that noise reduction and high speed processing become possible. Additionally, the selection line U2 is perpendicular to the contact 26A as well as to the plate surface of the silicon wafer 30 and provides wiring that runs in the shortest route between the contact 26A and the source line driver 38 of the silicon wafer 30, so that noise reduction and high speed processing become possible.

The three-dimensional memory 10 of the first embodiment has the vertical bit line B3A that connects the bit line B1A formed in the memory cell array 20A to the bit line B1B formed in the memory cell array 20B and the vertical bit line B3B that connects the bit line B2A formed in the memory cell array 20A to the bit line B2B formed in the memory cell array 20B. By applying a positive voltage to the vertical bit lines B3A, B3B respectively by the bit line driver 32, a positive voltage can be applied to the bit lines B1A, B1B connected to the vertical bit line B3A and to the bit lines B2A, B2B connected to the vertical bit line B3B. Therefore, in the three-dimensional memory 10 of the first embodiment, the bit line B1A formed in the memory cell array 20A and provided with a positive voltage and the bit line B1B formed in the memory cell array 20B and provided with a positive voltage are made to have the same potential by the vertical bit line B3A, whereas the bit line B2A formed in the memory cell array 20A and provided with a positive voltage and the bit line B2B formed in the memory cell array 20B and provided with a positive voltage are made to have the same potential by the vertical bit line B3B.

The three-dimensional memory 10 of the first embodiment has the vertical word line W5A that connects the word line W1A formed in the memory cell array 20A to the word line W1B formed in the memory cell array 20B and the vertical word line W5B that connects the word line W2A formed in the memory cell array 20A to the word line W2B formed in the memory cell array 20B. By applying a positive voltage to the vertical word lines W5A, W5B respectively by the word line driver 36, a positive voltage can be applied to the word lines W1A, W1B connected to the vertical word line W5A and to the word lines W2A, W2B connected to the vertical word line W5B. Therefore, in the three-dimensional memory 10 of the first embodiment, the word line W1A formed in the memory cell array 20A and provided with a positive voltage and the word line W1B formed in the memory cell array 20B and provided with a positive voltage are made to have the same potential by the vertical word line W5A, whereas the word line W2A formed in the memory cell array 20A and provided with a positive voltage and the word line W2B formed in the memory cell array 20B and provided with a positive voltage are made to have the same potential by the vertical word line W5B.

In cases where the vertical bit lines B3A, B3B are arranged perpendicularly to the plate surfaces of the memory cell arrays 20A, 20B like the three-dimensional memory of the first embodiment, the bit line B1A formed in the memory cell array 20A and the bit line BIB formed in the memory cell array 20B are connected to each other in the shortest route by the vertical bit line B3A, whereas the bit line B2A formed in the memory cell array 20A and the bit line B2B formed in the memory cell array 20B are connected to each other in the shortest route by the vertical bit line B3B. In the three-dimensional memory 10, improved wiring efficiency can be thus achieved by connecting the bit lines B1A and B1B to each other in the shortest route and the bit lines B2A and B2B to each other in the shortest route.

According to the bias control method for the three-dimensional memory 10 of the first embodiment, in the memory cell array 20A, the extending direction of the source line S1A to which the source electrodes of the memory transistors 31A, 33A are commonly connected is 90 degrees away from the bit lines B1A, B2A connected to the drain electrodes of the memory transistors 31A, 33A, and the source lines S1A, S2B are respectively independently connected to the source bias line SB1. Thereby, in the three-dimensional memory 10, the memory transistor, in which a positive voltage is applied to the drain electrode through the bit line B1A and the source electrode is connected to the ground through the source bias line SB1 and the vertical source bias line SB5 during data readout operation, is limited to the memory transistor 31A located at the position where the source line S1A and the bit line B1A intersect. Even when the unselected memory transistor 32A, for instance, is in a depletion state and a positive voltage is applied to the bit line B1A, the source electrode of the transistor 32A is not connected to the ground and therefore a leakage current does not flow therein. According to the bias control method for the three-dimensional memory 10 of the first embodiment, a flow of leakage current is thus restrained. In addition, even when many unselected memory transistors are connected to the bit line B1A, the potential of the bit line B1A can be prevented from dropping, by restraining a flow of leakage current. Therefore, data readout errors owing to a drop in the potential of the bit line B1A can be restrained in the bias control method for the three-dimensional memory 10.

According to the bias control method of the three-dimensional memory 10 of the first embodiment, in the memory cell array 20A, for instance, the selection transistors 41A, 42A corresponding to the source lines S1A, S2A respectively can be independently turned ON so that the source lines S1A, S2A can be independently connected to the ground through the source bias line SB1 and the vertical source bias line SB5. Therefore, the source lines can be selectively connected to the ground. For instance, when connecting the source line S1A connected to the source electrode of the transistor 31A to the ground in order to read data out of the memory transistor 31A, the selection transistor 41A is turned ON whereas the selection transistor 42A is turned OFF, so that the source line S2A connected to the unselected memory transistors 32A, 34A are not connected to the ground. This reduces the possibility that the source line connected to the source electrodes of unselected memory transistors is connected to the ground. Accordingly, in the bias control method of the three-dimensional memory 10 of the first embodiment, the possibility that the source line connected to the source electrodes of unselected memory transistors is connected to the ground is suppressed and therefore even if a depletion condition arises in an unselected memory transistor, a flow of leakage current from the drain electrode to the source electrode in unselected memory transistors can be restrained.

Second Exemplary Embodiment

Figure 3:
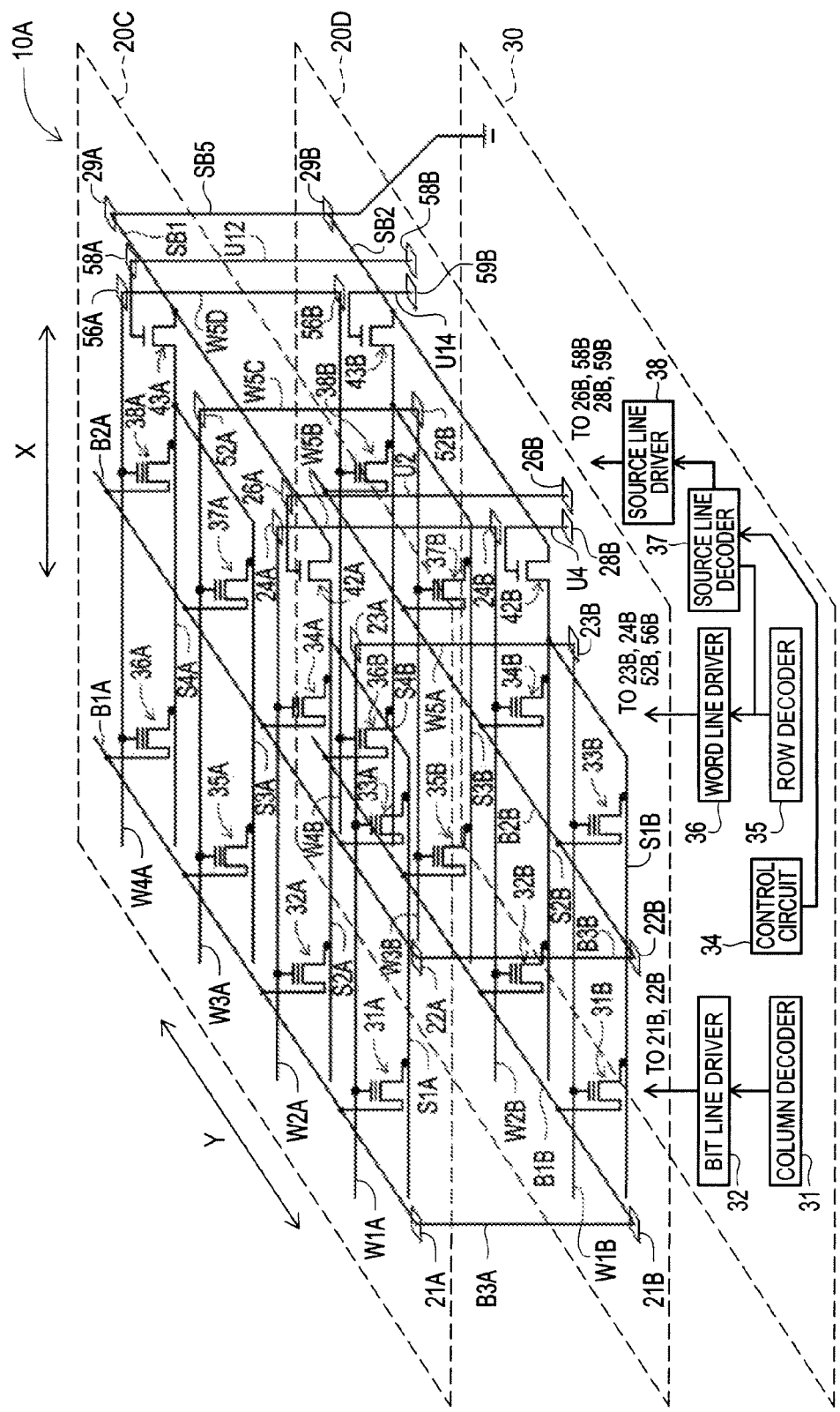
FIG. 3 is a schematic circuit diagram of a three-dimensional memory according to a second embodiment of the invention.

A second embodiment of the invention will be described with reference to FIG. 3. FIG. 3 is a schematic circuit diagram of a three-dimensional memory 10A. In this embodiment, those parts that are substantially equivalent to the parts of the first embodiment are indicated by the same numerals and an explanation thereof is omitted. The three-dimensional memory 10A has memory cell arrays 20C, 20D and a silicon wafer 30. The memory cell array 20C has memory transistors 31A to 38A, bit lines B1A, B2A, source lines S1A to S4A, word lines W1A to W4A and selection transistors 42A, 43A.

The source lines S3A, S4A are aligned with a specified spacing in a longitudinal direction (Y direction in the drawing) of the memory cell array 20C so as to extend in a lateral direction (X direction in the drawing) of the memory cell array 20C, similarly to the source lines S1A, S2A. The extending direction of the source lines S3A, S4A (X direction) is 90 degrees away from the extending direction of the bit lines B1A, B2A (Y direction), similarly to the source lines S1A, S2A. One end of the source line S1A is connected to the source line S2A. One end of the source line S3A is connected to the source line S4A.

The word lines W3A, W4A are aligned with a specified spacing in the longitudinal direction (Y direction in the drawing) of the memory cell array 20C so as to extend in the lateral direction (X direction in the drawing) of the memory cell array 20C, but are located at positions different from the positions of the source lines S3A, S4A.

The bit line B1A is connected to the drain electrodes of the memory transistors 35A, 36A. The source electrode of the memory transistor 35A is connected to the source line S3A. The gate electrode of the memory transistor 35A is connected to the word line W3A. The source electrode of the memory transistor 36A is connected to the source line S4A. The gate electrode of the memory transistor 36A is connected to the word line W4A.

The bit line B2A is connected to the drain electrodes of the memory transistors 37A, 38A. The source electrode of the memory transistor 37A is connected to the source line S3A, similarly to the source electrode of the memory transistor 35A. The gate electrode of the memory transistor 37A is connected to the word line W3A, similarly to the gate electrode of the memory transistor 35A. The source electrode of the memory transistor 38A is connected to the source line S4A, similarly to the source electrode of the memory transistor 36A. The gate electrode of the memory transistor 38A is connected to the word line W4A, similarly to the gate electrode of the memory transistor 36A.

The drain electrode of the selection transistor 43A is connected to the source lines S3A, S4A. The source electrode of the selection transistor 43A is connected to the source bias line SB1. Connected to the source bias line SB1 is not only the source electrode of the selection transistor 42A but also the source electrode of the selection transistor 43A. The drain electrode of the selection transistor 42A is connected to the source lines S1A, S2A. The selection transistor 43A corresponds to the first source selector switch of the invention.

The memory cell array 20D has memory transistors 31B to 38B, bit lines B1B, B2B, source lines S1B to S4B, word lines W1B to W4B and selection transistors 42B, 43B. The source lines S3B, S4B are aligned with a specified spacing in a longitudinal direction (Y direction in the drawing) of the memory cell array 20D so as to extend in a lateral direction (X direction in the drawing) of the memory cell array 20D, similarly to the source lines S1B, S2B. The extending direction of the source lines S3B, S4B (X direction) is 90 degrees away from the extending direction of the bit lines B1B, B2B (Y direction), similarly to the source lines S1B, S2B. One end of the source line S1B is connected to the source line S2B. One end of the source line S3B is connected to the source line S4B.

The word lines W3B, W4B are aligned with a specified spacing in the longitudinal direction (Y direction in the drawing) of the memory cell array 20D so as to extend in the lateral direction (X direction in the drawing) of the memory cell array 20D, but are located at positions different from the positions of the source lines S3B, S4B.

The bit line B1B is connected to the drain electrodes of the memory transistors 35B, 36B. The source electrode of the memory transistor 35B is connected to the source line S3B. The gate electrode of the memory transistor 35B is connected to the word line W3B. The source electrode of the memory transistor 36B is connected to the source line S4B. The gate electrode of the memory transistor 36B is connected to the word line W4B.

The bit line B2B is connected to the drain electrodes of the memory transistors 37B, 38B. The source electrode of the memory transistor 37B is connected to the source line S3B, similarly to the source electrode of the memory transistor 35B. The gate electrode of the memory transistor 37B is connected to the word line W3B, similarly to the gate electrode of the memory transistor 35B. The source electrode of the memory transistor 38B is connected to the source line S4B, similarly to the source electrode of the memory transistor 36B. The gate electrode of the memory transistor 38B is connected to the word line W4B, similarly to the gate electrode of the memory transistor 36B.

The drain electrode of the selection transistor 43B is connected to the source lines S3B, S4B. The source electrode of the selection transistor 43B is connected to the source bias line SB2. Connected to the source bias line SB2 is not only the source electrode of the selection transistor 42B but also the source electrode of the selection transistor 43B. The drain electrode of the selection transistor 42B is connected to the source lines S1, S2B. The selection transistor 43B corresponds to the first source selector switch of the invention.

The word line W3A is connected to the word line W3B through a contact 52A of the memory cell array 20C by the vertical word line W5C. The word line W4A is connected to the word line W4B through a contact 56A of the memory cell array 20C by a vertical word line W5D. The vertical word lines W5C, W5D are arranged perpendicularly to the plate surfaces of the memory cell arrays 20C, 20D. The vertical word lines W5C, W5D correspond to the interlayer word lines of the invention.

The vertical word line W5C is connected to the word line driver 36 through a contact 52B of the memory cell array 20D. In addition, the vertical word line W5D is connected to the word line driver 36 through a contact 56B of the memory cell array 20D.

The gate electrode of the selection transistor 43A is connected to the source line driver 38 through a contact 58B of the memory cell array 20D, a selection line U12 and a contact 58A of the memory cell array 20C. The gate electrode of the selection transistor 43B is connected to the source line driver 38 through a contact 59B of the memory cell array 20D and a selection line U14.

Next, the operation of the three-dimensional memory 10A of the second embodiment will be described. Herein, an explanation of the same operation as of the three-dimensional memory 10 of the first embodiment is skipped. The three-dimensional memory 10A operates as follows during operation for reading data from the memory transistor 31A.

The source line driver 38 selects the selection line U2 connected to the gate electrode of the selection transistor 42A according to a row address decoded by the source line decoder 37. The source line driver 38 applies a voltage to the gate electrode of the selection transistor 42A through the selection line U2 so as to turn the transistor 42A ON. Thereby, the source line S2A is grounded through the selection transistor 42A, the source bias line SB1 and the vertical source bias line SB5. In the three-dimensional memory 10A, the source line S1A connected to the source line S2A is also connected to the ground through the selection transistor 42A, the source bias line SB1 and the vertical source bias line SB5.

In the three-dimensional memory 10A, in a condition that the source lines S2A, S1A are connected to the ground and a positive voltage is applied to the bit line B1A and the word line W1A, similarly to the three-dimensional memory 10 of the first embodiment, a check is made to determine whether a current flows in the memory transistor 31A and read data is identified.

In the memory transistor 32A the drain electrode of which is connected to the bit line B1A, the source line S2A connected to the source electrode of the memory transistor 32A is connected to the ground in a condition that a positive voltage is applied to the bit line B1A. It is conceivable that a leakage current flows in the memory transistor 32A when it is in a depletion state. Even in this case, a drop in the potential of the bit line B1A owing to the leakage current can be restrained to such a degree that a data read error does not occur. Therefore, this situation may be coped with by reducing the number of source lines connected to one selection transistor.

Effect of Second Exemplary Embodiment

In the three-dimensional memory 10A of the second embodiment, two source lines S1A, S2A are connected to one selection transistor 42A in the memory cell array 20C. Therefore, in the three-dimensional memory 10A, the number of selection transistors and the spacing between the source lines S1A, S2A in the Y direction can be reduced, compared to cases where one source line is connected to one selection transistor. In addition, in the memory cell array 20C, two source lines S3A, S4A are connected to one selection transistor 43A. Therefore, in the three-dimensional memory 10A, the space occupied by selection transistors and the spacing between the source lines S3A, S4A in the Y direction can be reduced, compared to cases where one source line is connected to one selection transistor.

In the three-dimensional memory 10A of the second embodiment, two source lines S1B, S2B are connected to one selection transistor 42B in the memory cell array 20D. Therefore, in the three-dimensional memory 10A, the spacing between the source lines S1B, S2B in the Y direction can be reduced, similarly to the memory cell array 20C. In addition, in the memory cell array 20D, two source lines S3B, S4B are connected to one selection transistor 43B. Therefore, in the three-dimensional memory 10A, the spacing between the source lines S3B, S4B in the Y direction can be reduced, similarly to the memory cell array 20C.

Third Exemplary Embodiment

Figure 4:
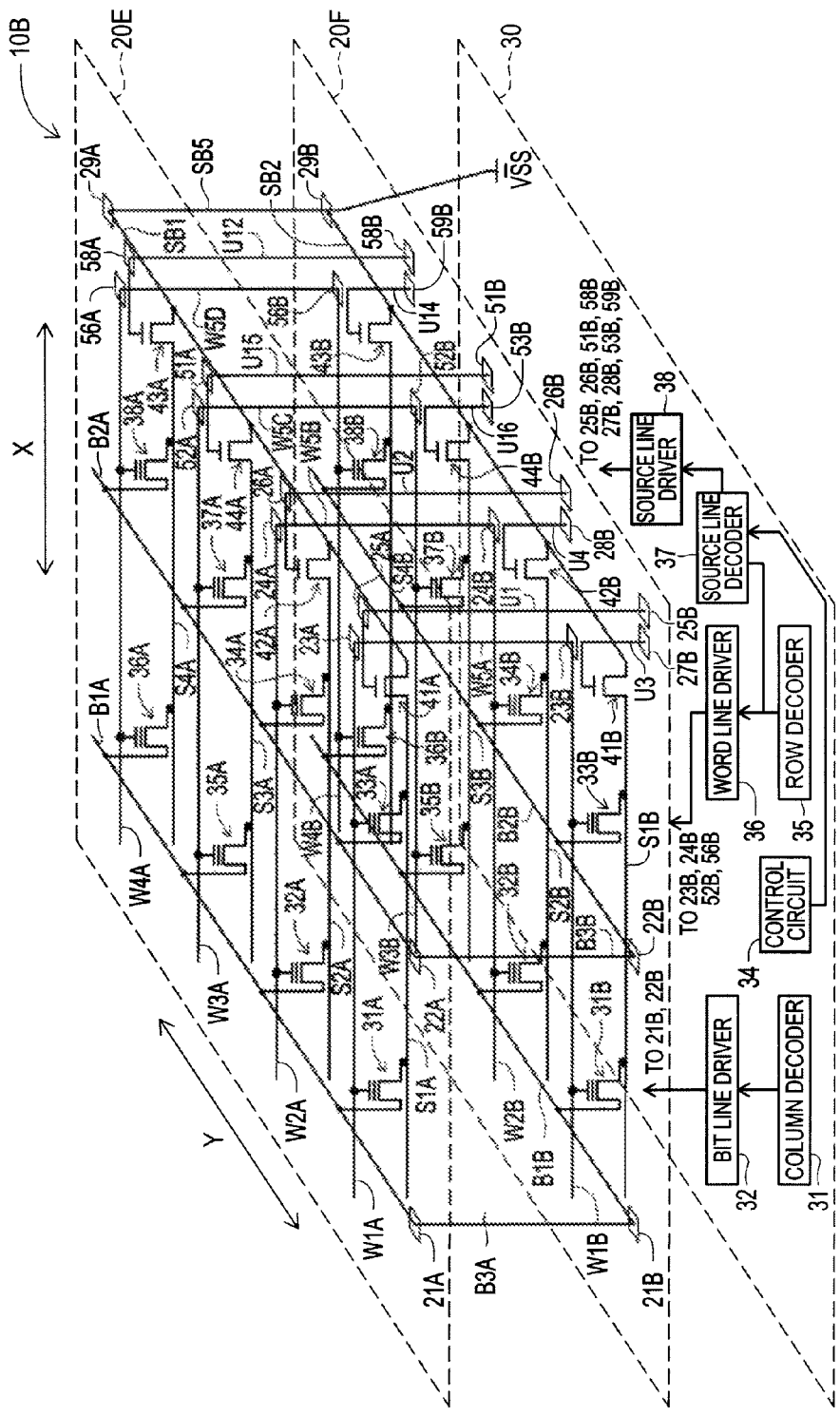
FIG. 4 is a schematic circuit diagram of a three-dimensional memory according to a third embodiment of the invention.

Reference is made to FIG. 4 to describe a third embodiment of the invention. FIG. 4 is a schematic circuit diagram of a three-dimensional memory 10B. In this embodiment, those parts that are substantially equivalent to the parts of the first and second embodiments are indicated by the same numerals and an explanation thereof is omitted. The three-dimensional memory 10B has memory cell arrays 20E, 20F and a silicon wafer 30.

The memory cell array 20E has memory transistors 31A to 38A, bit lines B1A, B2A, source lines S1A to S4A, word lines W1A to W4A and selection transistors 41A to 44A. The drain electrode of the selection transistor 44A is connected to the source line S3A. The source electrode of the selection transistor 44A is connected to the source bias line SB1. The source bias line SB1 is connected not only to the source electrode of the selection transistor 44 but also to the source electrodes of the selection transistors 41A to 43A. The selection transistor 44A corresponds to the first source selector switch of the invention.

The memory cell array 20F has memory transistors 31B to 38B, bit lines B1B, B2B, source lines S1B to S4B, word lines W1B to W4B and selection transistors 41B to 44B. The drain electrode of the selection transistor 44B is connected to the source line S3B. The source electrode of the selection transistor 44B is connected to the source bias line SB2. The source bias line SB2 is connected not only to the source electrode of the selection transistor 44 but also to the source electrodes of the selection transistors 41B to 43B. The selection transistor 44B corresponds to the first source selector switch of the invention.

The gate electrode of the selection transistor 44A is connected to the source line driver 38 through a contact 51B of the memory cell array 20F, a selection line U15 and a contact 51A of the memory cell array 20E. Further, the gate of the selection transistor 44B is connected to the source line driver 38 through a contact 53B of the memory cell array 20F and a selection line U16.

Figure 5:
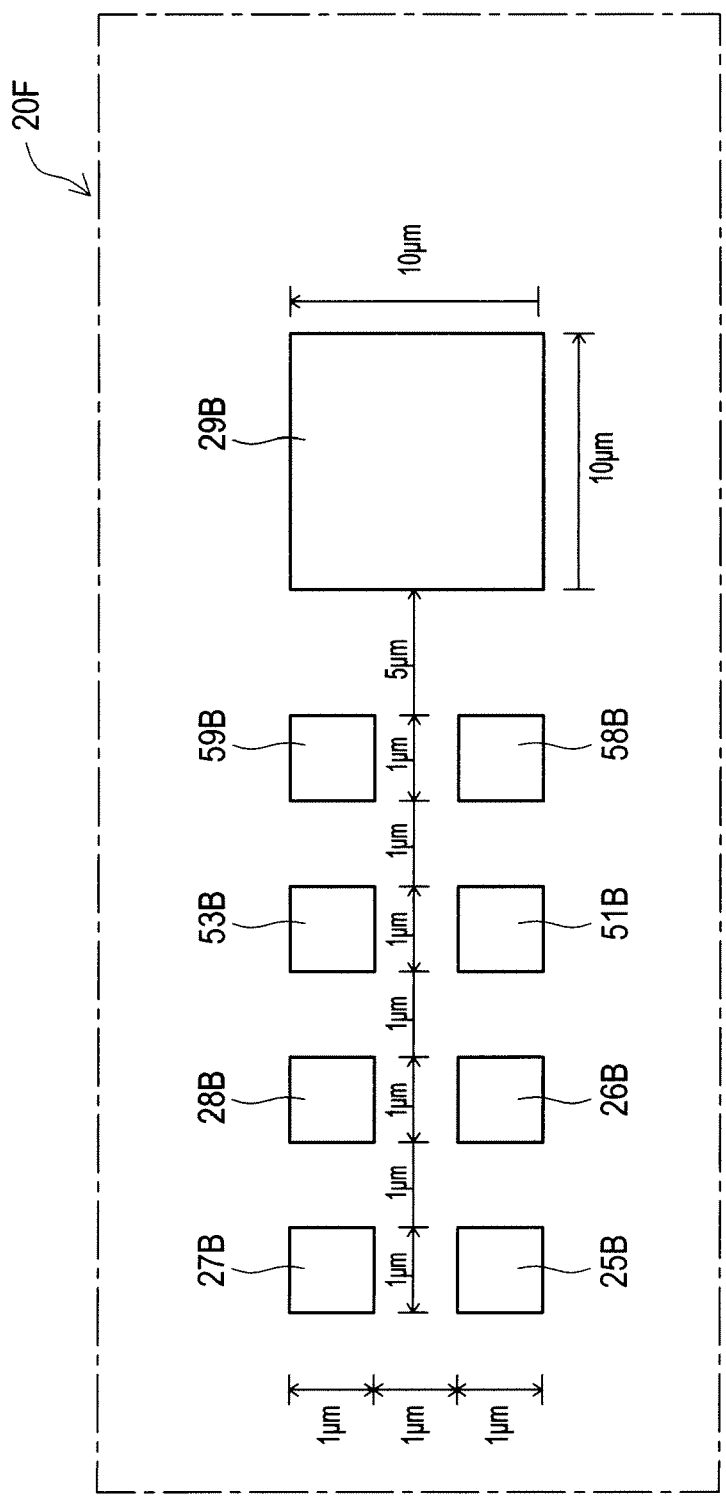
FIG. 5 is a schematic enlarged layout plan of contacts formed in memory cell arrays provided in the three-dimensional memory of the third embodiment.

Next, there will be explained in detail the layout of the contact 25B etc. formed in the memory cell array 20F in a case where two memory cell arrays 20E, 20F are provided and four source lines are formed in each of the memory cell arrays 20E, 20F like the three-dimensional memory 10B. FIG. 5 is a schematic enlarged layout plan of the contacts 25B to 28B and the contacts 51B, 53B, 58B, 59B. Herein, the area of the contact 25B etc. formed in the memory cell array 20F will be explained in comparison with the area of the contacts of a conventional layout illustrated in FIG. 6.

Figure 6:
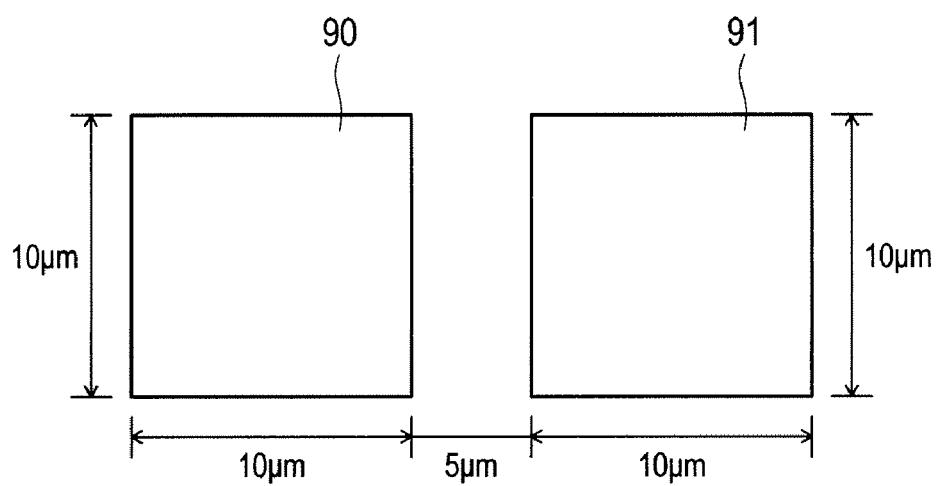
FIG. 6 is a schematic enlarged layout plan of contacts formed in memory cell arrays provided in a conventional three-dimensional memory.

In the conventional three-dimensional memory, four source lines S1A to S4A formed in the memory cell array corresponding to the memory cell array 20E of the three-dimensional memory 10B of the third embodiment are connected to the ground through a contact 90 formed in the memory cell array corresponding to the memory cell array 20F of the third embodiment, as illustrated in FIG. 6.

For maintaining the potential of the four source lines at ground potential, it is necessary to decrease the resistance of the contact 90 and increase the current capacity of the contact 90. It is conceivable, particularly, in the case of the conventional three-dimensional memory that many memory transistors are arranged in the memory cell arrays and a large current flows from the four source lines through the contact 90 during a program mode or erase mode in which these memory transistors are activated at the same time. Therefore, the area of the contact 90 needs to be set to $100\,\mu m^2$ ($10\,\mu m$ (longitudinal length)$\times 10\,\mu m$ (lateral length)).

In the conventional three-dimensional memory, the potentials of the source lines S1B to S4B formed in the memory cell array corresponding to the memory cell array 20F of the three-dimensional memory 10B of the third embodiment need to be maintained at ground potential in addition to the above four source lines S1A to S4A. It is therefore necessary to provide the memory cell array corresponding to the memory cell array 20F with a contact 91 in addition to the contact 90. The contact 91 has the same area ($100\,\mu m^2$) as of the contact 90.

Therefore, in the conventional three-dimensional memory, the memory cell array corresponding to the memory cell array 20F of the third embodiment needs an area of $250\,\mu m^2$ ($100\,\mu m^2 + 50\,\mu m^2 + 100\,\mu m^2$) in order to form two contacts 90, 91 arranged with a specified spacing ($5\,\mu m^2$).

In contrast with this, the three-dimensional memory 10B of the third embodiment is configured such that a voltage for turning the transistors 41A to 44A ON is applied to the selection transistors 41A to 44A which can connect the source lines S1A to S4A to the source bias line SB1 through the contacts 25B, 26B, 51B, 58B, in order to maintain the potentials of the four source lines S1A to S4A formed in the memory cell 20E at ground potential VSS.

The value of a current for gate driving required for turning all the selection transistors 41A to 44A ON is smaller than the aforesaid value of a current that flows from the four source lines through the contact 90 in the conventional three-dimensional memory. In the three-dimensional memory 10B of the third embodiment, the area of a single contact is $1\,\mu m^2$ ($1\,\mu m$ (longitudinal length)$\times 1\,\mu m$ (lateral length)). Therefore, the area required for forming all the contacts 25B to 28B, 51B, 53B, 58B, 59B which are arranged with a specified spacing ($1\,\mu m^2$) between every two adjacent contacts is $21\,\mu m^2$ (longitudinal length ($1\,\mu m\times 3$)$\times$lateral length ($1\,\mu m\times 7$)).

In cases where the contact 29B to which the source bias line SB2 is connected is formed in the memory cell array 20F in addition to the above contact group, the area required for forming the contact group, the contact 29B and a specified space ($10\,\mu m$ (longitudinal length)$\times 5\,\mu m$ (lateral length)) is $171\,\mu m^2$ ($21\,\mu m^2 + 50\,\mu m^2 + 100\,\mu m^2$). In the three-dimensional memory 10B of the third embodiment, the area ($171\,\mu m^2$) occupied by the contacts of the memory cell array 20F necessary to maintain the potentials of the four source lines of the memory cell arrays 20E, 20F at the ground potential VSS is smaller than the occupied area ($250\,\mu m^2$) of the contacts in the conventional three-dimensional memory. This example of the calculation result of the area occupied by the contacts in the memory cell array 20F is applicable to Patent Document 1.

In the three-dimensional memory 10B of the third embodiment, the memory transistor the source electrode of which is connected to the ground through the source line S1A, the selection transistor 41A, the source bias line SB1 and the vertical source bias line SB5 is limited to the memory transistor 31A located at the position where the source line S1A and the bit line B1A intersect, similarly to the three-dimensional memory 10 of the first embodiment.

In the memory cell array 20E of the three-dimensional memory 10B of the third embodiment, the source bias line SB1 is commonly connected to all the selection transistors 41A to 44A. Further, in the memory cell array 20F, the source bias line SB2 is commonly connected to all the selection transistors 41B to 44B. Therefore, in the three-dimensional memory 10B, there is no need to connect the selection transistors to different source bias lines so that the number of source bias lines can be reduced compared to cases where the selection transistors are connected to different source bias lines.

In the case where the memory cell array 20B is incorporated in the silicon wafer 30 of the three-dimensional memory 10B of the third embodiment, the selection line U1 that connects the source line driver 38 to the gate of the selection transistor 41A is positioned between the memory cell array 20B and silicon wafer 30 which are arranged in layers. In such a case, the wiring length of the selective line U1 can be reduced compared to cases where the memory cell array 20B and the silicon wafer 30 are arranged with a specified spacing therebetween.

Fourth Exemplary Embodiment

Figure 7:
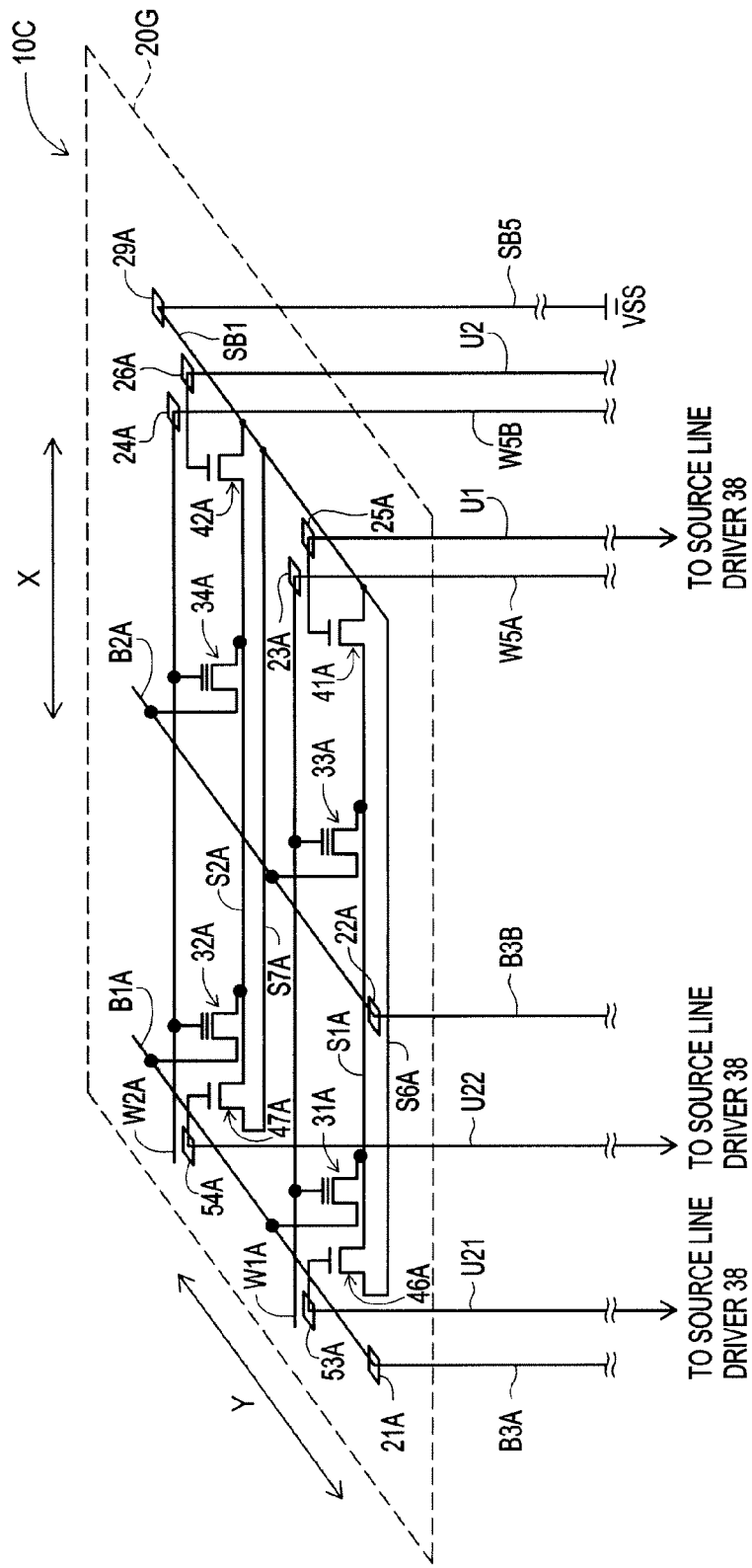
FIG. 7 is a schematic circuit diagram of a three-dimensional memory according to a fourth embodiment of the invention.

Reference is made to FIG. 7 to describe a fourth embodiment of the invention. FIG. 7 is a schematic circuit diagram illustrating a part of a three dimensional memory 10C. In this embodiment, those parts that are substantially equivalent to the parts of the first embodiment are indicated by the same numerals and an explanation thereof is omitted. The three-dimensional memory 10C has a memory cell array 20G.

The memory cell array 20G has memory transistors 31A to 34A, bit lines B1A, B2A, source lines S1A, S2A, S6A, S7A, word lines W1A, W2A and selection transistors 41A, 42A, 46A, 47A. One end of the source line S6A is connected to one end of the source bias line SB1. One end of the source line S7A is connected to one end of the source bias line SB1.

The drain electrode of the selection transistor 46A is connected to the source line S1A. The source electrode of the selection transistor 46A is connected to the source line S6A. The drain electrode of the selection transistor 47A is connected to the source line S2A. The source electrode of the selection transistor 47A is connected to the source line S7A. The selection transistors 46A, 47A correspond to the first source selector switch of the invention.

The gate electrode of the selection transistor 46A is connected to the source line driver 38 through a contact 53A of the memory cell array 20G by a selection line U21. The gate electrode of the selection transistor 47A is connected to the source line driver 38 through a contact 54A of the memory cell array 20G by a selection line U22.

Next, the operation of the three-dimensional memory 10C of the fourth embodiment will be described. In this embodiment, an explanation of the same processes as of the operation of the three-dimensional memory 10 of the first embodiment is omitted. The three-dimensional memory 10C operates as follows when reading data out from the memory transistor 31A.

In accordance with a row address decoded by the source decoder (not shown), the source line driver 38 selects the selection line U21 connected to the gate electrode of the selection transistor 46A in addition to the selection line U1 connected to the gate electrode of the selection transistor 41A. The source line driver 38 applies a voltage to the gate electrode of the selection transistor 41A and the gate electrode of the selection transistor 46A through the selection lines U1, U21 so that the selection transistors 41A, 46A are turned ON. Thereby, one end of the source line S1A is connected to the ground through the selection transistor 41A, the source bias line SB1 and the vertical source bias line SB5 whereas the other end of the source line S1A is connected to the ground through the selection transistor 46A, the source line S6A, the source bias line SB1 and the vertical source bias line SB5.

In the three-dimensional memory 10C, in a condition that both ends of the source line S1A are connected to the ground and a positive voltage is applied to the bit line B1A and the word line W1A, a check is made to determine whether a current flows in the memory transistor 31A and read data is identified.

Figure 8:
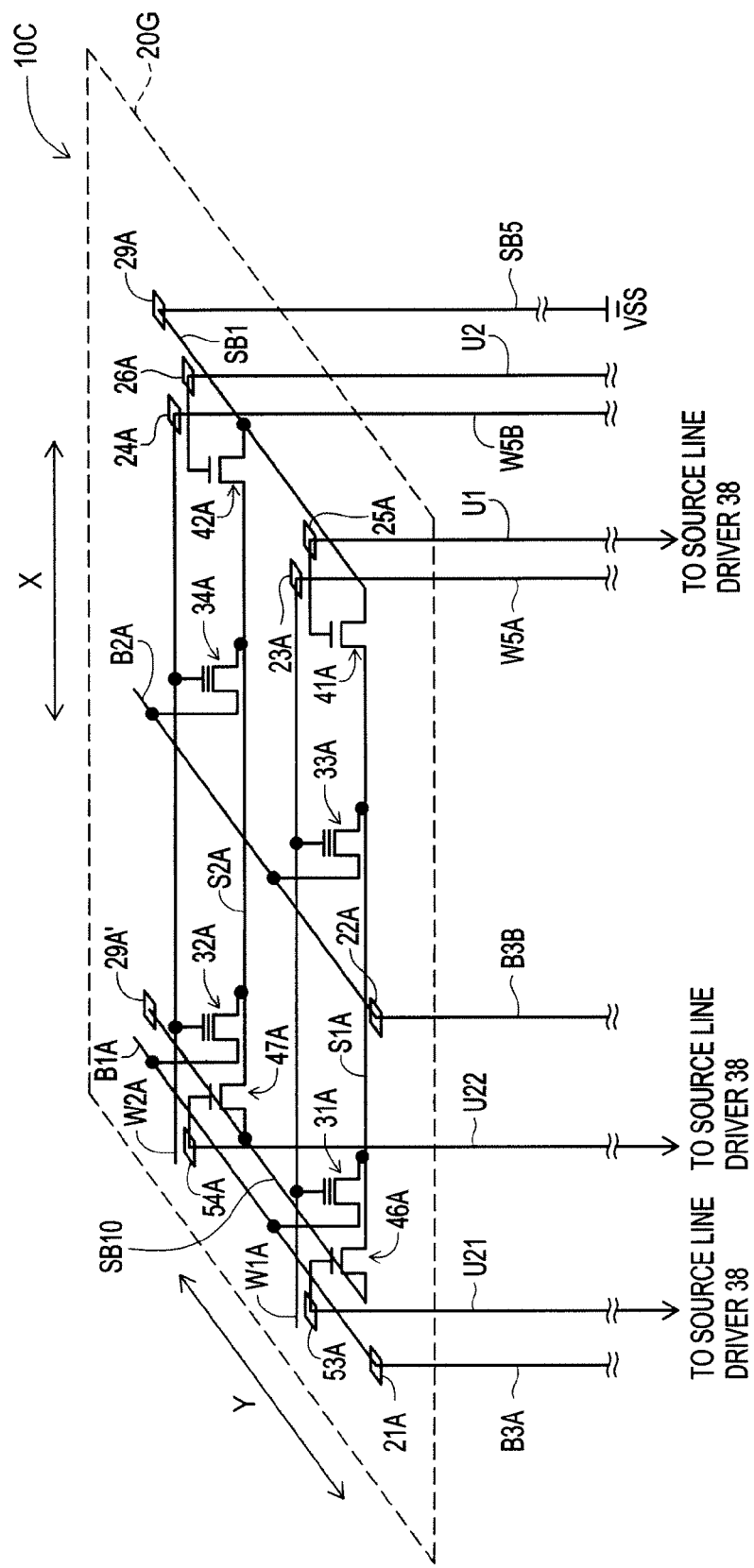
FIG. 8 is a schematic circuit diagram of a three-dimensional memory according to one modification of the fourth embodiment.
Figure 9:
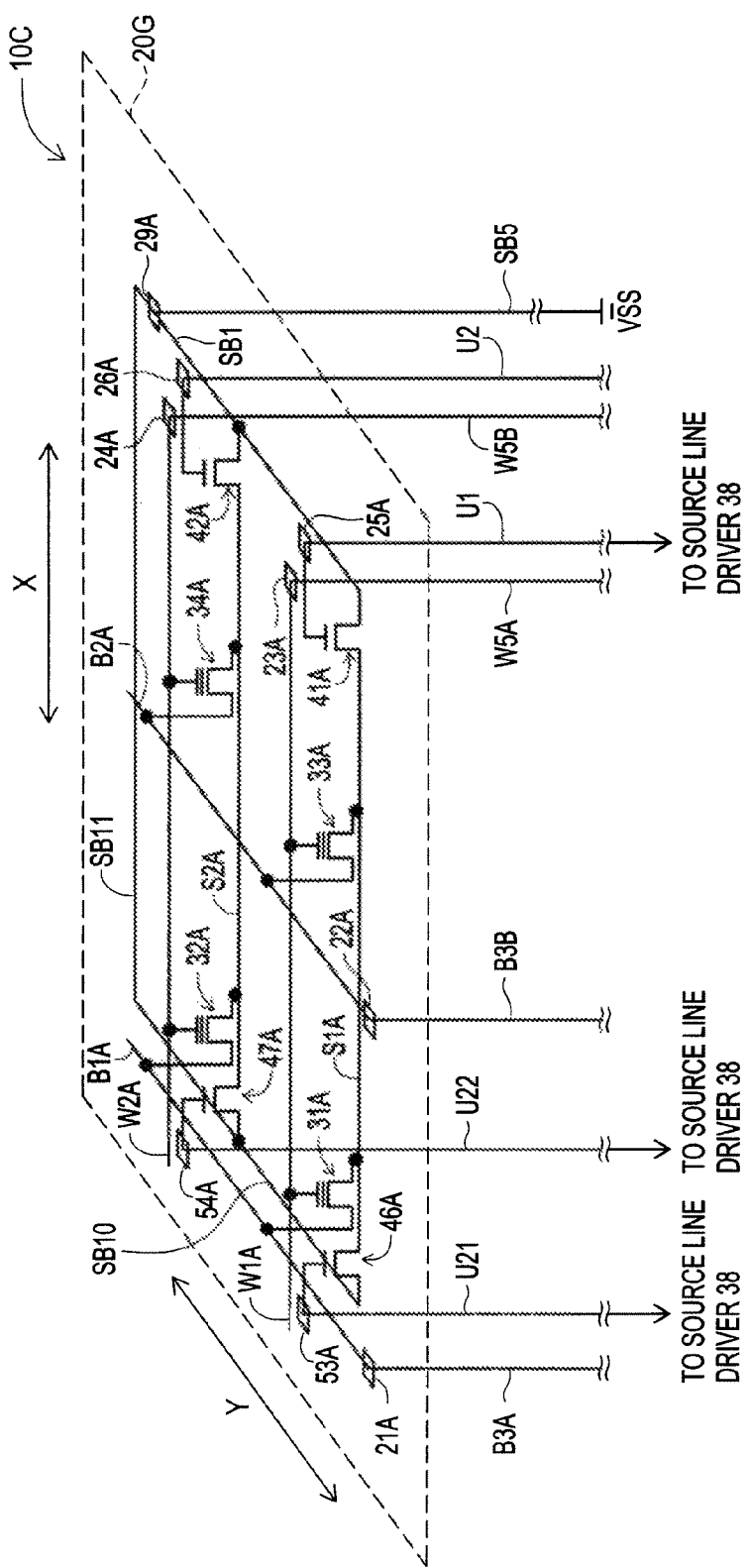
FIG. 9 is a schematic circuit diagram of a three-dimensional memory according to another modification of the fourth embodiment.
Figure 10:
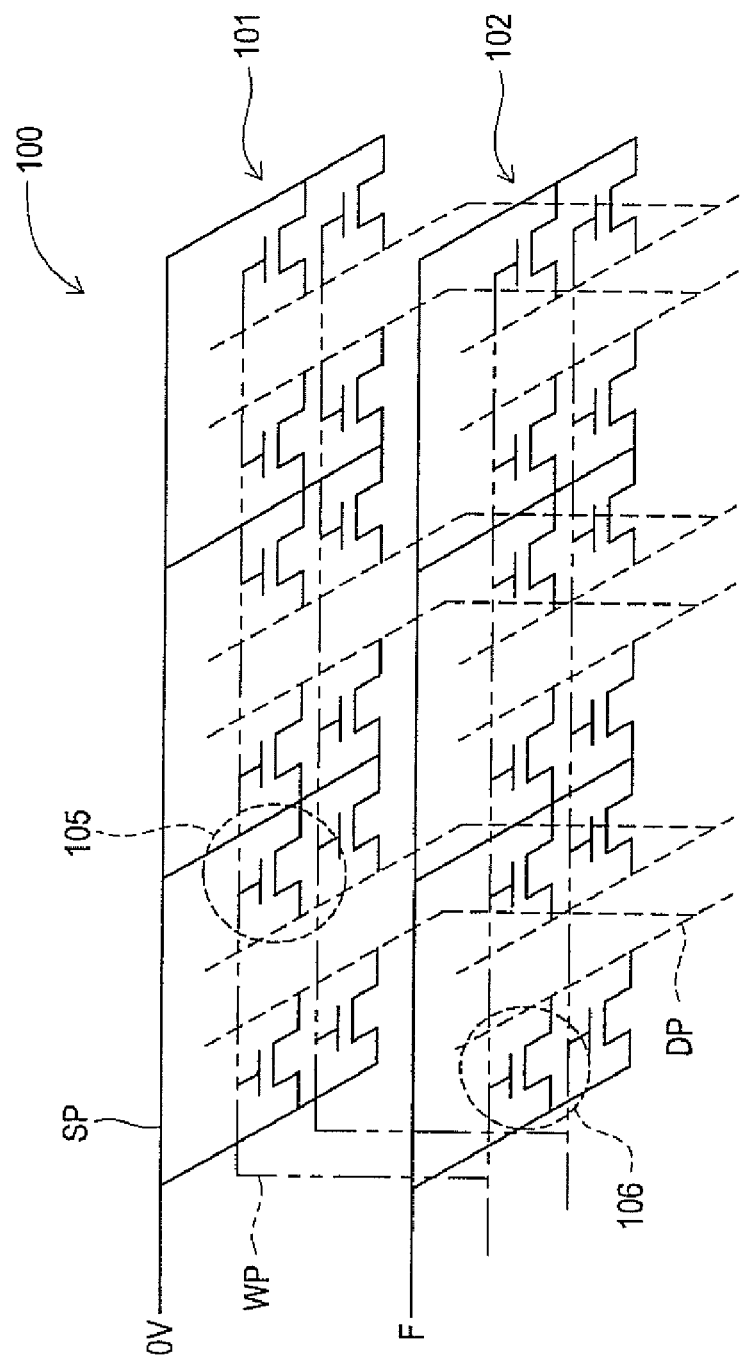
FIG. 10 is a schematic circuit diagram of the conventional three-dimensional memory.

As illustrated in FIG. 8, the three-dimensional memory 10C may be configured such that a source bias line SB10 is formed in the memory cell array 20G in place of the source lines S6A, S7A and the source electrodes of the selection transistors 46A, 47A are respectively connected to the source bias line SB10. In the three-dimensional memory 10C, the source bias line SB10 may be connected to the ground through a contact 29A' and a vertical source bias line (not shown) that is similar to the vertical source bias line SB5. Further, the source bias line SB10 and the source bias line SB1 may be connected to each other by a source bias connection line SB11 and the contact 29A as illustrated in FIG. 9. The source bias connection line SB11 corresponds to the source bias communication line of the invention.

In the three-dimensional memory 10C illustrated in FIG. 8, the number of source lines formed in the memory cell array 20G can be reduced because the source bias line SB10 is formed in the memory cell array 20G in place of the source lines S6A, S7A shown in FIG. 7. Therefore, in the three-dimensional memory 10C, the spacing between the source lines S1A and S2A in the Y direction can be reduced to half compared to the case where the source lines S6A, S7A are formed.

In the three dimensional memory 10C illustrated in FIG. 9, there is no need to connect a vertical source bias line to each of the source bias lines SB1, SB10, because the source bias line SB10 is connected to the source bias line SB1 through the source bias line SB11 and the contact 29A. Accordingly, in the three-dimensional memory 10C, the number of vertical source bias lines can be reduced and in consequence, the design of wiring layout can be facilitated, compared to the case where the vertical source bias line is connected to each of the source bias lines SB1, SB10.

In the three-dimensional memory 10C of the fourth embodiment, the wiring length of each of the selection lines U1, U2, U21, U22 can be reduced by provision of a lamination layer structure in which the memory cell array 20G and the silicon wafer 30 are arranged in layers, compared to the case where the memory cell array 20G and the silicon wafer 30 are arranged with a specified spacing. It should be noted that the selection lines U1, U2, U21, U22 correspond to the second layered source bias line of the invention.

In the three-dimensional memory 10C of the fourth embodiment, both ends of the source line S1A are made connectable to the source bias line SB1, for instance, by the selection transistors 41A, 46A connected to the both ends, respectively, of the source line S1A in order to supply the ground potential VSS to the source line S1A from both ends thereof. Accordingly, in the three-dimensional memory 10C of the fourth embodiment, the ground potential VSS can be supplied to the source line S1A through both ends thereof after starting readout of data from, for instance, the memory transistor 31A, so that uniform supply of the ground potential VSS to the source line S1A becomes possible, thereby promptly changing the potential of the source line S1A to the ground potential VSS. This enables it to make the even properties of all the memory transistors connected to the source line S1A uniform to thereby achieve improved access time.

In the three-dimensional memory 10C of the fourth embodiment, the selection transistors 41A, 46A are connected to the both ends, respectively, of the source line S1A so that the current driving ability of each of the selection transistors 41A, 46A required for maintaining the potential of the source line S1A at the ground potential VSS can be reduced, compared to the case where either the selection transistor 41A or the selection transistor 46A is connected to one end of the source line S1A. By virtue of the reduction in the required current driving ability, the selection transistors 41A, 46A can be respectively reduced in size, compared to the case where either the selection transistor 41A or the selection transistor 46A is connected to one end of the source line S1A. The reduction in the size of the selection transistors 41A, 46A leads to a reduction in the area occupied by the selection transistors 41A, 46A in the memory cell array 20G In the three-dimensional memory 10C of the fourth embodiment, effective arrangement of the selection transistors 41A, 46A in the memory cell array 20G is enabled by placing them in an empty space of the memory cell array 20G.

The invention is not necessarily limited to the particular embodiments shown herein and various changes and modifications are made to the disclosed embodiments without departing from the spirit and scope of the invention. For instance, the three-dimensional memory 10B of the third embodiment may be modified such that multiple bit parallel access is enabled by turning on not only the selection transistor 41A but also the selection transistor 43A. Thereby, it can be determined whether current flows in the memory cell transistors 31A and 36A which are disposed distantly from each other and the read data from the memory transistors 31A, 36A can be identified, in a condition that a positive voltage is applied to the bit line B1A and the word line W1A. It should be noted that turning ON of the selection transistor 43A in addition to turning ON of the selection transistor 41A corresponds to the source line biasing step of the invention.

It is also possible to form the bit lines so as to extend in the lateral direction (X direction) of the memory cell arrays while forming the source lines and word lines so as to extend in the longitudinal direction (Y direction) of the memory cell arrays, unlike the first to fourth embodiments described earlier. Thereby, read data from the memory transistors disposed discretely from one another in the lateral direction of the memory cell arrays can be identified and thus, multiple bit parallel access can be implemented. In addition, the three-dimensional memory may be configured such that the bit lines are arbitrarily arranged with respect to the longitudinal and lateral directions of the memory cell arrays and also, the source lines and word lines are arbitrarily formed with respect to the lateral and longitudinal directions of the memory cell arrays. Thereby, read data from the memory transistors arranged discretely from one another in the longitudinal direction of the memory cells and read data from the memory transistors arranged discretely from one another in the lateral direction of the memory cells can be respectively identified, thereby implementing multiple bit parallel access.

What is claimed is:

1. A nonvolatile storage device having a memory cell array composed of a plurality of memory cells, the memory cell array comprising:
   a bit line to which the drain terminals of the plurality of memory cells having noncovalent connected gate terminals are commonly connected;
   a source line to which the source terminals of the plurality of memory cells having commonly connected gate terminals are commonly connected and which extend perpendicularly to the bit line;
   a first source selector switch for connecting the source line to a source bias line wherein the source bias line is connected to a plurality of first source selector switches that are connected to both ends of the source line; and
   a source bias communication line for connecting the source bias lines to each other, the source bias lines being connected to the first source selector switches that are connected to both ends of a plurality of source lines.

2. The nonvolatile storage device according to claim 1, wherein the memory cell array has a plurality of said first source selector switches and the plurality of first source selector switches are individually connected to the source bias line.

3. The nonvolatile storage device according to claim 2, wherein the memory cell array and a substrate having a driving circuit for driving the memory cells provided in the memory cell array are arranged in layers which comprise a first layered source bias line that connects the source bias line to a source line provided in the substrate.

4. The nonvolatile storage device according to claim 3, further comprising:
   a first switch selection line located between the memory cell array and the substrate, for connecting the first source selector switches to the driving circuit.

5. The nonvolatile storage device according to claim 3, wherein the substrate has an integrated circuit.

6. The nonvolatile storage device according to claim 3, wherein at least two said memory cell arrays are arranged in layers and the source bias line of a lower memory cell array is connected to the source bias line of an upper memory cell array by the first layered source bias line.

7. The nonvolatile storage device according to claim 6, wherein a second switch selection line, which connects the first source selector switch to the driving circuit, is provided between the substrate and the upper memory cell array.

8. The nonvolatile storage device according to claim 3,
   wherein at least two said memory cell arrays are arranged in layers;
   wherein the lower memory cell array is integrally formed with the substrate, forming a substrate-integrated type memory cell array; and
   wherein a source line provided in the substrate-integrated type memory cell array is connected to the source bias line provided in the upper memory cell array by the first layered source bias line.

9. The nonvolatile storage device according to claim 8, further comprising a third switch selection line located between the upper memory cell array and the substrate-integrated type memory cell array, for connecting the first source selector switches provided in the upper memory cell array to the driving circuit.

10. The nonvolatile storage device according to claim 1, wherein the memory cell array and a substrate having a driving circuit for driving the memory cells provided in the memory cell array are arranged in layers and which further comprises second layered source bias lines for connecting the source bias lines to source lines provided in the substrate.

11. The nonvolatile storage device according to claim 1, wherein source lines are connected to the first source selector switch.

12. The nonvolatile storage device according to claim 1, wherein the memory cell array has a word line to which the gate terminals of the plurality of memory cells are commonly connected and the word line extends in parallel with the source line.

13. The nonvolatile storage device according to claim 12,
wherein the memory cell array and a substrate having a driving circuit for driving the memory cells provided in the memory cell array are arranged in layers;
wherein the substrate has a first decoder for selecting the word line connected to the gate terminal of a memory cell to be accessed; and
wherein the first source selector switch is selected according to the result of decoding performed by the first decoder.

14. The nonvolatile storage device according to claim 13, further comprising a second decoder for further decoding the result of decoding performed by the first decoder,
wherein if the word lines connected to the gate terminals of a plurality of memory cells to be accessed are selected by the first decoder, the first source selector switch for biasing the source line connected to the source terminals of the memory cells to be accessed is selected in accordance with the decoding results of the first decoder and the second decoder.

* * * * *